US006624504B1

(12) United States Patent
Inoue et al.

(10) Patent No.: US 6,624,504 B1
(45) Date of Patent: Sep. 23, 2003

(54) SEMICONDUCTOR DEVICE AND METHOD FOR MANUFACTURING THE SAME

(75) Inventors: Kosuke Inoue, Fujisawa (JP); Hiroyuki Tenmei, Yokohama (JP); Yoshihide Yamaguchi, Fujisawa (JP); Noriyuki Oroku, Yokohama (JP); Hiroshi Hozoji, Yokohama (JP); Shigeharu Tsunoda, Fujisawa (JP); Madoka Minagawa, Ebina (JP); Naoya Kanda, Fujisawa (JP); Ichiro Anjo, Tokyo (JP); Asao Nishimura, Tokyo (JP); Akira Yajima, Ebina (JP); Kenji Ujiie, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/698,185

(22) Filed: Oct. 30, 2000

(30) Foreign Application Priority Data

Oct. 29, 1999 (JP) ............................................. 11-307986
Apr. 28, 2000 (JP) ....................................... 2000-134214

(51) Int. Cl.[7] ........................................... H01L 23/495
(52) U.S. Cl. ........................ 257/668; 257/737; 257/738; 257/780; 257/781
(58) Field of Search ................................ 257/737, 738, 257/781, 780, 784, 701, 668

(56) References Cited

U.S. PATENT DOCUMENTS

| | | | | |
|---|---|---|---|---|
| 4,983,023 A | * | 1/1991 | Nakagawa et al. | 350/344 |
| 6,037,662 A | * | 3/2000 | Yoon et al. | 257/735 |
| 6,168,872 B1 | * | 1/2001 | Ohashi et al. | 428/620 |
| 6,242,799 B1 | * | 6/2001 | Horiuchi et al. | 257/700 |
| 6,313,532 B1 | * | 11/2001 | Shimoishizaka et al. | 257/734 |
| 6,456,100 B1 | * | 9/2002 | Hembree et al. | 324/755 |

FOREIGN PATENT DOCUMENTS

| | | |
|---|---|---|
| JP | 7-202362 | 8/1995 |
| JP | 8-274243 | 10/1996 |

(List continued on next page.)

OTHER PUBLICATIONS

Dictionary of Mounting Technology In Electronics, Jan. 20, 1992, p. 103.
2000–333526—Partial English translation of Official Action mailed Oct. 29, 2002.
2000–333528—Partial English translation of Official Action mailed Oct. 29, 2002.

* cited by examiner

*Primary Examiner*—David L. Talbott
*Assistant Examiner*—Luan Thai
(74) *Attorney, Agent, or Firm*—Antonelli, Terry, Stout & Kraus, LLP

(57) ABSTRACT

A semiconductor apparatus includes a semiconductor device having circuit electrodes aligned centrally of the semiconductor apparatus. A first electrically insulating layer is formed on said semiconductor device with said circuit electrodes being exposed from said first insulating layer. A second electrically insulating layer is formed on said first insulating layer, and external connection terminals are formed on said second insulating layer. A wiring is formed on said second insulating layer to electrically connect said external connect terminals to said circuit electrodes of said semiconductor device, and a third electrically insulating layer is formed on said second insulating layer and on said wiring. Particles are provided in the second insulating layer to control a shape of said second insulating layer.

24 Claims, 25 Drawing Sheets

FOREIGN PATENT DOCUMENTS

| | | |
|---|---|---|
| JP | 9-199635 | 7/1997 |
| JP | 9-219421 | 8/1997 |
| JP | 09-252034 | 9/1997 |
| JP | 9-321084 | 12/1997 |
| JP | 10-242333 | 9/1998 |
| JP | 10-92865 | 10/1998 |
| JP | 11-54649 | 2/1999 |
| JP | 11-147950 | 6/1999 |
| JP | 11-191571 | 7/1999 |
| JP | 11-191572 | 7/1999 |
| JP | 11-204678 | 7/1999 |
| JP | 11-274155 | 10/1999 |
| JP | 11-274365 | 10/1999 |
| JP | 11-354560 | 12/1999 |
| JP | 2000-164761 | 6/2000 |
| JP | 2001-118956 | 4/2001 |
| WO | WO 96/09645 | 3/1996 |
| WO | WO 98/25298 | 11/1998 |
| WO | WO 99/23696 | 5/1999 |
| WO | WO 00/52755 | 8/2000 |

WHOLE CHIP VIEW

CHIP ENLARGED VIEW

RELATIONSHIP BETWEEN
FILM THICKNESS AND FILM STRESS

FILM THICKNESS VS.
α-RAY TRNSMITTANCE

PHYSICAL VALUES AND SPUTTER RESISTANCE OF
STRESS RELAXATION LAYER CANDIDATE MATERIAL
(X:OCCURRENCE OF CRACKS, △:OCCURRENCE OF WRINKLE,
○:NO ABNORMALITY)

SEMICONDUCTOR DEVICE AND METHOD FOR MANUFACTURING THE SAME

CROSS-REFERENCE TO RELATED APPLICATIONS

The present application is related to application Ser. No. 09/698,168 filed on Oct. 30, 2000 by H. Temmei and eleven others corresponding to Japanese Patent Application No. 11-307986 filed Oct. 29, 1999 and Japanese Patent Application Nos. 2000-134213 and 2000-134215 both filed Apr. 28, 2000, the content of which is incorporated herein by reference in its entirety, and is also related to application Ser. No. 09/698,186 filed on Oct. 30, 2000 by K. Inoue and eleven others corresponding to Japanese Patent Application No. 11-307986 filed Oct. 29, 1999 and Japanese Patent Application Nos. 2000-134209, 2000-134210 and 2000-134211 all of the three filed Apr. 28, 2000, the content of which is also incorporated herein by reference in its entirety.

BACKGROUND OF THE INVENTION

The present invention relates to a structure of a semiconductor device for flip chip bonding and a method for producing the semiconductor device.

Most of semiconductor devices have a multi-layer structure in which electrically insulating layers are disposed between the respective layers. Each of the electrically insulating layers has one or more opening portions. There exists wiring for connecting a terminal on a lower side of the electrically insulating layer to a terminal on an upper side of the electrically insulating layer through the opening portion in each insulating layer.

The following method is used for forming such an electrically insulating layer. That is, an opening portion is formed in an electrically insulating layer by the steps of: applying a photosensitive electrically insulating material onto a semiconductor device by a spin coating method; and performing exposure and development thereon. Metal wiring for connecting a terminal on a lower side of the electrically insulating layer to a terminal on an upper side of the electrically insulating layer is formed by the steps of: applying a second photosensitive material onto a layer on the upper side of the electrically insulating layer; performing exposure and development thereon to form a mask; and carrying out a process such as plating, sputtering, CVD, evaporation, etc. The photosensitive electrically insulating material used as mask is removed after it becomes no longer necessary.

Wiring for connecting a terminal on the lower side of the electrically insulating layer to a terminal on the upper side of the electrically insulating layer can be formed by the aforementioned steps. FIG. 31 is a sectional view showing a part of the semiconductor device formed by the aforementioned steps. In FIG. 31, an aluminum pad 7 is a terminal on a lower side of an electrically insulating layer 12, and a bump pad 3 is a terminal on an upper side of the electrically insulating layer 12. The electrically insulating layer 12 which is formed on a wafer 9 having a semiconductor formed thereon has an opening portion formed over the aluminum pad 7. Metal wiring 11 is formed in an area from the aluminum pad 7 to the bump pad 3 above the electrically insulating layer 12. A bump 10 is formed on the bump pad 3. Incidentally, the formation of wiring in an area from the aluminum pad 7 to the bump pad 3 is termed "distribution". In this illustration, the thickness of the electrically insulating layer 12 is selected to be approximately equal to the thickness of the metal wiring 11.

Flip chip bonding may be a model of method of mounting and bonding a semiconductor device, which is produced in the aforementioned steps, onto a circuit substrate such as a printed wiring board. FIG. 32 is a sectional view of a flip chip-bonded semiconductor device. The bump 10 provided on a terminal of the semiconductor device 13 is once melted and then solidified again on the circuit substrate 14 to thereby bond the semiconductor device 13 onto the circuit substrate 14. A gap between the semiconductor device 13 and the circuit substrate 14 is filled with a highly rigid resin. Incidentally, the resin is termed "underfill 15" and effects reinforcement of the junction portion. JP-A-11-111768 discloses an example of flip chip bonding by use of the underfill.

SUMMARY OF THE INVENTION

The aforementioned conventional art, however, has the following problems.

Firstly, there is difficulty in the method of supplying the resin to the gap between the semiconductor device and the circuit substrate. That is, a method using a capillary phenomenon is employed as the method of supplying the resin to the gap that is not larger than 0.3 mm generally. The resin as a material for the underfill is, however, a liquid resin with a high viscosity. Hence, there are problems that a great deal of time is required for filling the gap with the resin and that air bubbles often remain in the resin, etc.

Secondly, there is difficulty in detachment of the semiconductor device. That is, in case that the semiconductor device is to be detached from the circuit substrate for the reason that the semiconductor device bonded onto the circuit substrate is defective, the cured underfill material still remains on the circuit substrate even after the detachment of the semiconductor device. Hence, there is a problem to recycle the circuit substrate.

To solve the first and second problems, it is preferable that the semiconductor device is bonded onto the circuit substrate without application of the underfill. However, if the underfill is not applied, there will arise another problem that the junction lifetime of the semiconductor device is shortened extremely. This is because the underfill is applied for the purpose of preventing the junction portion from being destroyed owing to strain caused by heat generation in the junction portion at use of a finished electric appliance.

An object of the present invention is to form an electrically insulating layer on each of semiconductor devices even in the case where the length and width sizes of the semiconductor device are small, thereby attaining a semiconductor device where flip chip bonding can be performed without any underfill.

To achieve the foregoing object, the present invention is made as described in the appended claims. For example, a thick-film electrically insulating layer is printed so as to extend over a plurality of semiconductor devices. The thick film electrically insulating film is cut in a region on which there is no wiring to thereby divide the thick-film electrically insulating layer.

Hence, it is possible to provide a semiconductor device in which flip chip bonding can be performed without any underfill, and in which an electrically insulating layer can be formed on each semiconductor device even in the case where the length and width sizes of the semiconductor device are small. Incidentally, in this specification, the thick-film electrically insulating layer is referred to as "stress relaxation layer".

DETAILED DESCRIPTION OF THE EMBODIMENTS

An embodiment of the present invention will be described below with reference to the drawings. In all the drawings, like parts are referenced correspondingly. Hence, duplication of description will be often omitted and the scales of respective parts may be made different from those of actual parts for the purpose of facilitating the description.

Figure 1:
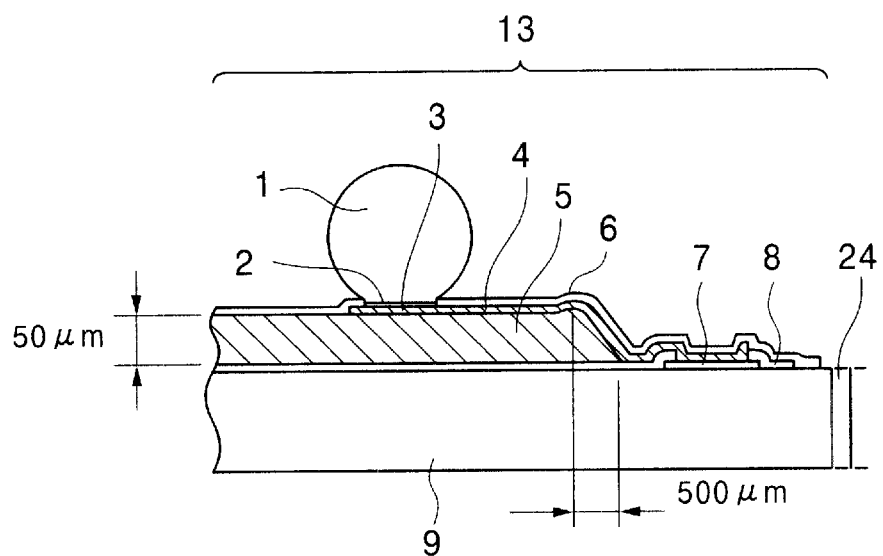
FIG. 1 is a sectional view showing a part of the structure of a semiconductor device according to an embodiment of the present invention.

The structure of a semiconductor device according to the present invention will be described at first. Although a large number of semiconductor devices are produced collectively on a wafer in practice, a part picked up from the wafer will be described for the purpose of facilitating the description. FIG. 1 shows a sectional view showing a part of the semiconductor device 13 according to this embodiment.

The wafer 9 having semiconductor circuits formed thereon means a wafer that is obtained after a Front End of the Line (FEOL) in a semiconductor producing process is performed and before the wafer is cut into a large number of semiconductor devices 13. Each semiconductor device 13 has an external connection terminal such as an aluminum pad 7. The aluminum pad 7 on which a gold wire or the like is connected is used for electrical connection to an external terminal of a semiconductor package such as a QFP (quad flat package) when the conventional semiconductor device 13 is encapsulated in a semiconductor package. While a dicing area 24 is used when the wafer 9 having the large number of semiconductors formed thereon is cut into chip-shape semiconductor devices 13, the surface of the semiconductor device 13 having the semiconductor circuit formed therein is covered with a protective film 8 except portions on the aluminum pad 7, the dicing area 24 and around the latter. The protective film 8 is made of a material having a thickness in a range of from 1 to 10 micrometers. Specifically, an electrically insulating resin of an inorganic material, or, a combination of an electrically insulating resin from an inorganic material and an electrically insulating resin of an organic material may be used as the protective film 8. That is, the protective film 8 may be made of an electrically insulating film of an inorganic material or may be made of a composite film consisting of an inorganic electrically insulating film of an inorganic material and an organic electrically insulating film of an organic material laminated on the inorganic one. In the composite film, a photosensitive resin material is preferably used as the organic film. Examples of the photosensitive material preferably used as the organic film in the protective film 8 in this embodiment include photosensitive polyimides, photosensitive benzocyclobutenes, photosensitive polybenzoxazoles, etc. In this embodiment, the material of the protective film is not limited to the aforementioned materials, but any suitable one of known available inorganic or organic materials or a composite film thereof may be used as the protective film. For example, SiN, $SiO_2$, or the like, can be used as the inorganic film.

Figure 33A:
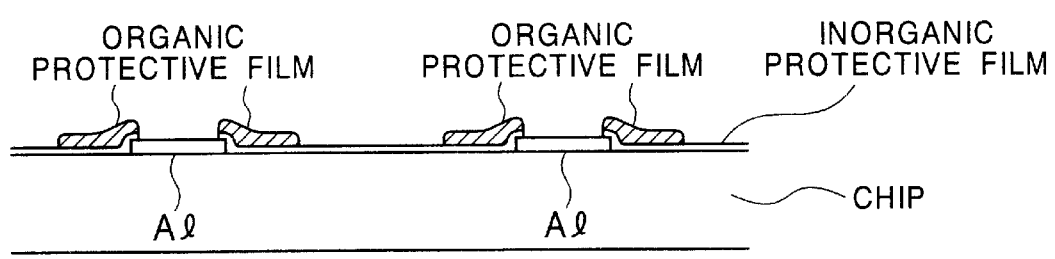
FIGS. 33a and 33b are views showing an embodiment of the structure of the semiconductor device according to the present invention.
Figure 33B:
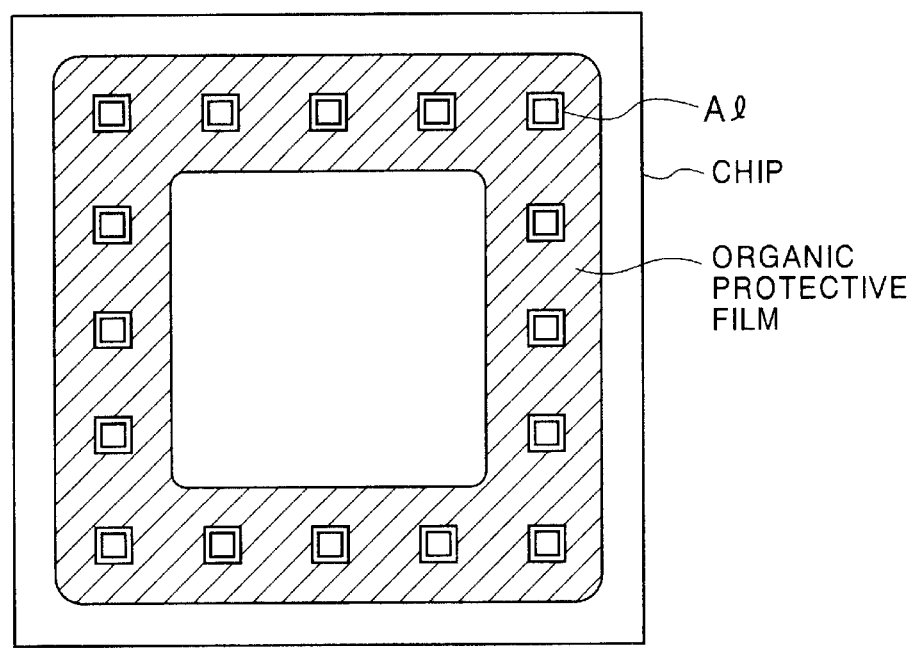
Figure 34A:
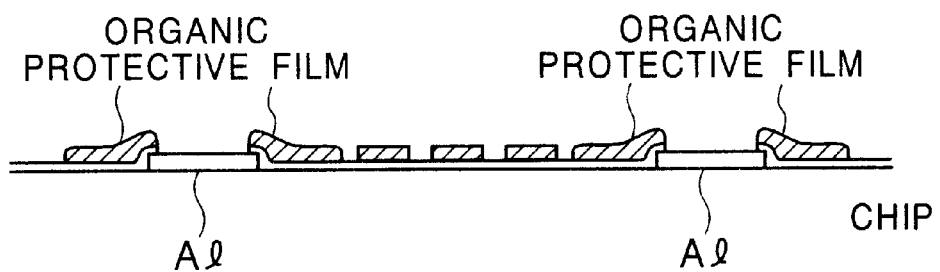
FIGS. 34a and 34b are views showing another embodiment of the structure of the semiconductor device according to the present invention.
Figure 34B:
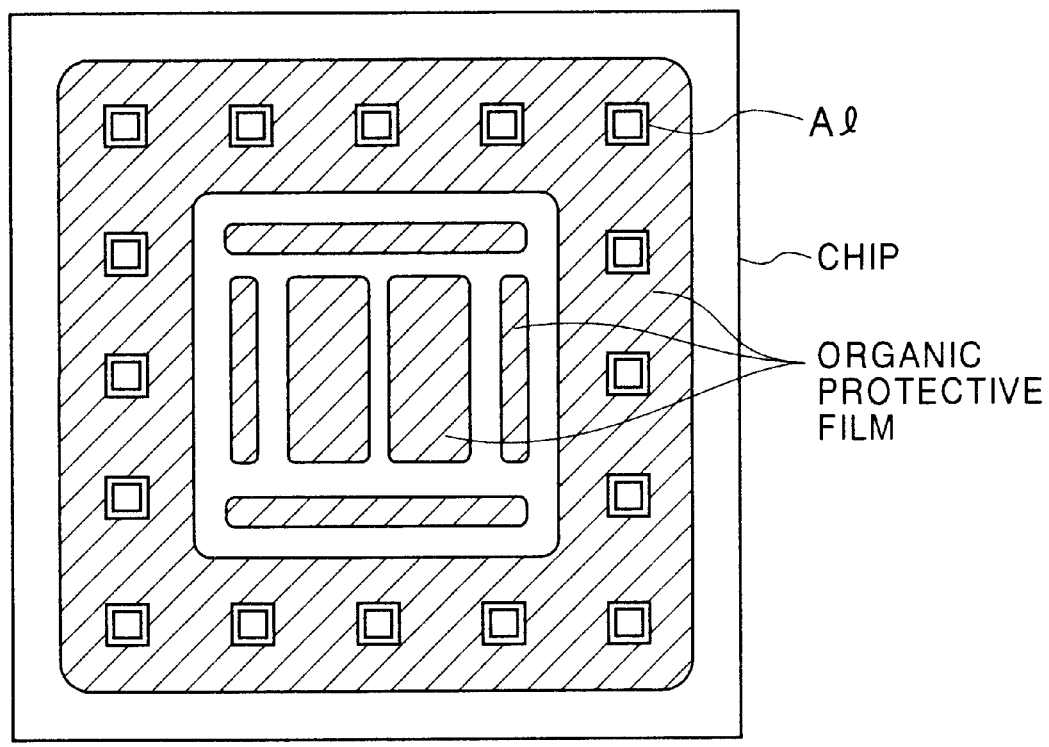
Figure 35:
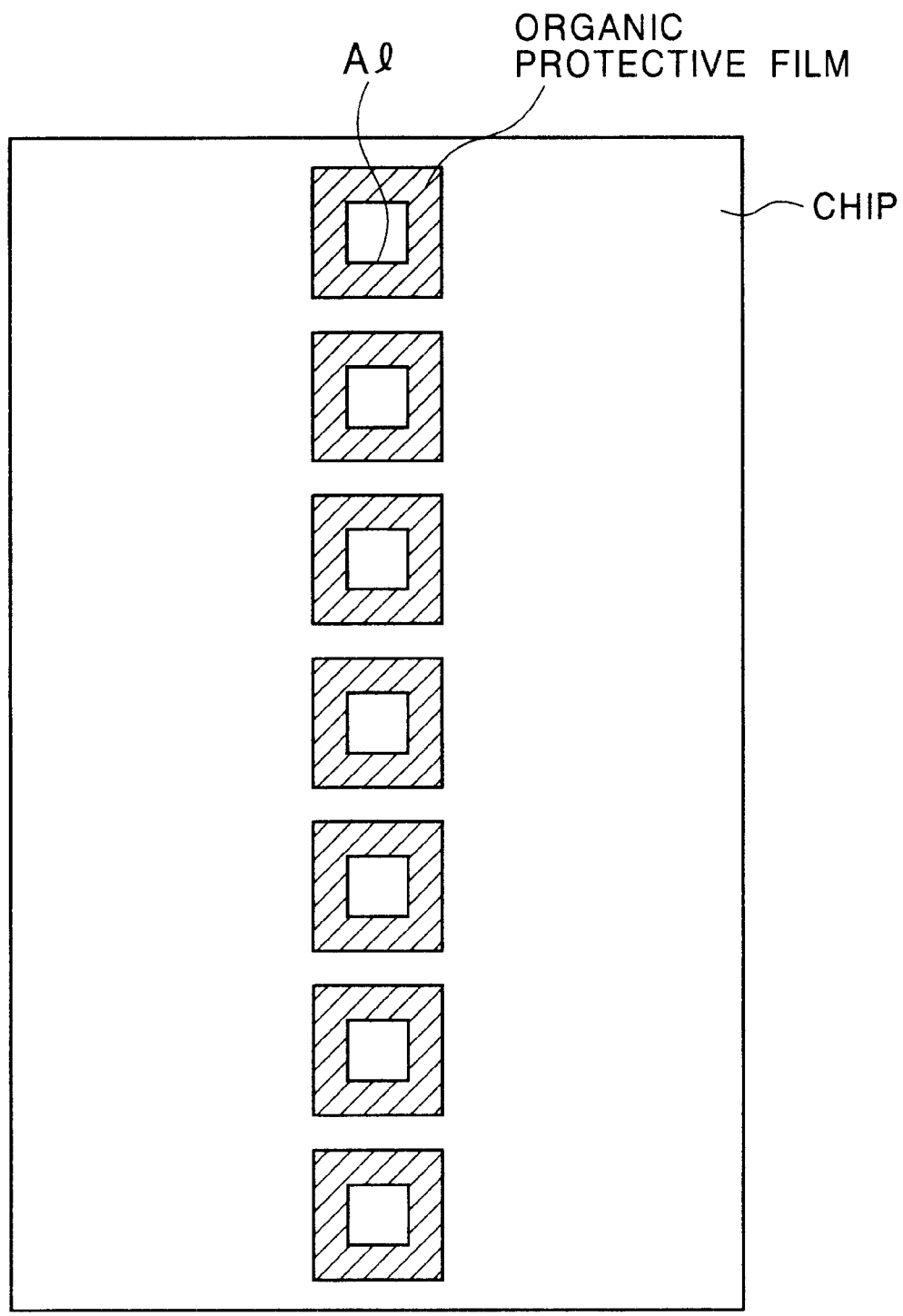
FIG. 35 is a view showing a further embodiment of the structure of the semiconductor device according to the present invention.

Of course, the organic film may cover almost the whole surface of the inorganic film. Alternately, the organic film may be formed only on a region around the vicinity of the aluminum pad 7 as shown in FIGS. 33a and 33b. Alternately, the organic film may be selectively formed in a plurality of optional places on the surface of the inorganic film as shown in FIGS. 34a and 34b. By limiting the organic film formation region as described above, the warpage of the wafer 9 induced by the internal stress in the protective film 8 can be reduced. This is advantageous in terms of handling in the production process, focussing at exposure, etc. The "region near the aluminum pad 7" in this embodiment means a region within the maximum distance of 1 mm from each edge of the aluminum pad 7. Although FIGS. 33a and 33b and FIGS. 34a and 34b show the cases where the organic film around the aluminum pad 7 is continuously formed, it is a matter of course that organic films are independently formed around individual aluminum pads respectively. Specifically, organic films may be formed in regions as shown in FIG. 35. What should be selected among the shapes shown in FIGS. 33a and 33b, FIGS. 34a and 34b and FIG. 35 is to be determined in consideration of the patterning precision of the photosensitive resin used for the organic film, the internal stress in the film and the device characteristic of the semiconductor device. To take the device characteristic as an example, the device characteristic means that the level of a potential barrier in each active cell (transistor) inside the device varies in accordance with the stress applied on the semiconductor device.

A stress relaxation layer 5 having a thickness in a range of from 35 to 150 micrometers is formed selectively on the protective film 8. The thickness of the stress relaxation layer cannot be decided precisely because it also depends on the size of the semiconductor device, the elastic modulus of the stress relaxation layer, the thickness of the semiconductor device, etc. According to a stress simulation experiment conducted upon a bimetal model constituted by a combination of a semiconductor device and a stress relaxation layer formed on a surface of the semiconductor device under the condition that the thickness of the semiconductor device generally used is in a range of from about 150 to about 750 micrometers, it has been found that the required thickness of the stress relation layer is preferably in a range of from 10 to 200 micrometers, more preferably in a range of from 35 to 150 micrometers. Accordingly, the thickness of the stress relaxation layer in this embodiment is selected to be in the more preferable range. The selected thickness of the stress relaxation layer corresponds to about 1/20 to about 1/5 as large as the thickness of the semiconductor device. If the thickness is smaller than 35 micrometers, desirable stress relaxation cannot be obtained. If the thickness is larger than 150 micrometers, a warp of the wafer is caused by the internal stress of the stress relaxation layer 5 per se. As a result, focussing failure in an exposure process, handling failure in a wiring process, or the like, is apt to occur. Hence, there is a problem that productivity is lowered. The stress relaxation layer 5 is made of a resin material having an elastic coefficient greatly smaller than that of the semiconductor wafer 9, for example, an elastic modulus in a range of from 0.1 GPa to 10 GPa at room temperature. When the elastic modulus of the stress relaxation layer is in this range, a reliable semiconductor device can be obtained. That is, if the elastic modulus of the stress relaxation layer is smaller than 0.1 GPa, the stress relaxation layer can hardly support the weight of the semiconductor device so that there may be apt to arise a problem that the characteristic of the semiconductor device becomes unstable. On the other hand, if the elastic modulus of the stress relaxation layer is larger than 10 GPa, a warp of the wafer is induced by the internal stress of the stress relaxation layer 5. As a result, focussing failure in an exposure process, handling failure in a wiring process, or the like, is apt to occur. Accordingly, there is even a risk that a disadvantage such as cracking of the wafer happens. An edge portion of the stress relaxation layer 5 is inclined at an average gradient of from 5 to 30%. If the inclination angle is lower than 5%, the inclined edge portion is too long to obtain a desired thickness. When, for example, the inclination angle is 3% in terms of average gradient, a horizontal distance of the left or right edge portion larger than 3 millimeters is respectively required for obtaining a thickness of 100 micrometers. Hence, if the total horizontal distance of the left and right edge portions is larger than about 7 millimeters, a desired thickness can be obtained. On the other hand, if the inclination angle is higher than 30%, there is no problem in the horizontal distance but there is a high risk that a step coverage cannot be obtained in the wiring process. Particularly there is sufficiently little process margin in a process of coating of a plating resist, exposure and development, so that remarkable skill and technique is required. If the inclination angle is further larger, stress is concentrated into the edge portion because of a so-called stress concentration effect. As a result, the redistributing wire 4 tends to be broken in the edge portion, so that the wiring structure may need to be formed with a special arrangement.

In FIG. 1, a film appears 50 micrometers thick at a horizontal distance of 500 micrometers from one edge of the stress relaxation layer 5. Hence, the average gradient is 10%. The redistributing wire 4 is made of an electrical conductor such as copper. The redistributing wire 4 connects the aluminum pad 7 to a protrusive electrode and a bump pad 3 on a surface of the stress relaxation layer 5. A gold plating 2 for preventing the bump pad 3 from being oxidized may be provided on the bump pad 3. While a dicing area 24 is provided for dicing the wafer 9 having the plurality of semiconductors into individual semiconductor devices 13, the surface of the semiconductor device 13 is covered with a surface protective film 6 except a portion on the bump pad 3 and on the dicing area 24.

The protective film 8 and the stress relaxation layer 5 are entirely covered and sealed with the surface protective film 6. Hence, the protective layer 8 and the stress relaxation layer 5 can be prevented from being peeled from the surface of the wafer 9 having the semiconductor devices formed thereon. Moreover, invasion of substances such as ions causing deterioration in performance of semiconductors can be reduced. Because the protective film 8, the stress relaxation layer 5 and the surface protective film 6 are all set back from the dicing area 24, they are not damaged when the wafer is diced and separated into the semiconductor devices.

Any kind of resin material having electrically insulating characteristic can be used as the surface protective film 6. Because it is necessary to be patterned, a photosensitive material is preferably used but a material suitable for high precision printing such as ink jet printing may be used to form the film 6 by printing. Alternately, the film 6 may be formed by the steps of: forming an electrically insulating film on a whole surface by an inexpensive coating method such as curtain coating; forming an etching resist as a resist pattern by a photolithography process; etching the electrically insulating film through the resist pattern; and removing the resist.

In this embodiment, various kinds of material may be used as the aforementioned materials. Examples of the material include: (1) acryl-modified photosensitive epoxy resins or photosensitive polyimide resins preferably used as photosensitive materials; (2) polyamideimide resins and polyimide resins preferably used as ink jet printing materials; and (3) modified triazole resins, modified melamine resins and polyimide resins preferably used as flat film-forming materials. More specifically, solder resist preferably used in a printed wiring board producing process as an inexpensive photosensitive resin material in a printed board producing process, photosensitive polyimide used in a surface cover of a flexible printed board, or the like, is preferably used as the photosensitive material for the surface protective film 6. On the other hand, Photoneece (trademark) made by Toray Industries, Inc., or the like, is preferably used as the flat film-forming material. Incidentally, the material used in this embodiment is solder resist.

A bump 1 is formed on the bump pad 3. The bump 1 is generally made of a solder material. The bump 1 serves as an external connection terminal here.

Figure 2:
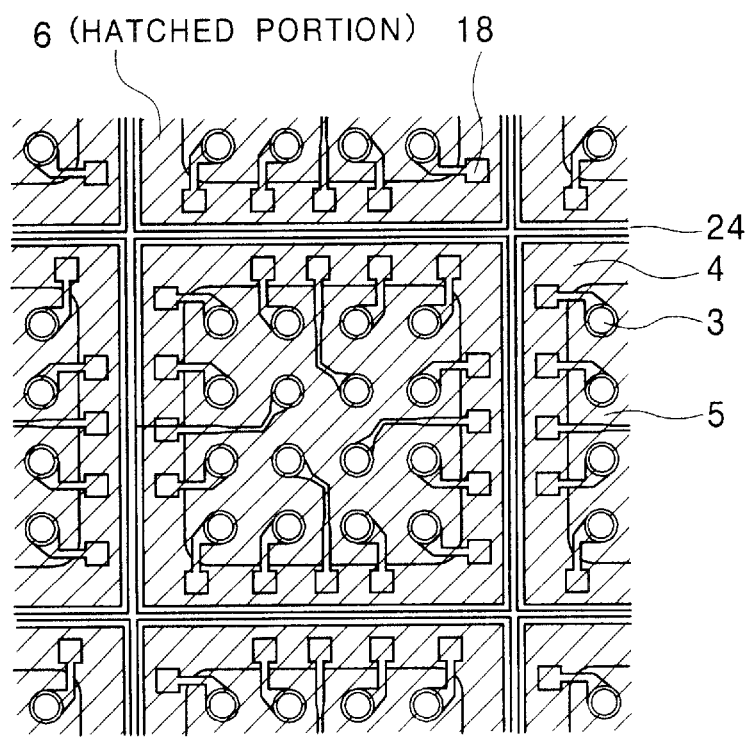
FIG. 2 is a plan view showing a state in which semiconductor devices according to the embodiment of the present invention are arranged continuously.

FIG. 2 is a plan view showing a state in which neighboring semiconductor devices 13 shown in FIG. 1 are formed adjacently on a wafer. Although bumps actually exist, they are omitted in FIG. 2. The hatched portion in FIG. 2 represents solder resist used as the surface protective film 6. Each stress relaxation layer 5 is shaped in a rectangular form having rounded corners. Each dicing area 24 is disposed between adjacent semiconductor devices 13 to thereby serve as a dicing tab for separating the semiconductor devices 13 individually. The dicing tab is preferably located in a range of, for example, from 10 to 100 micrometers from one edge of the surface protective film 6. If the dicing tab is located shorter than 10 micrometers from the edge, there is a tendency that chipping of the semiconductor device is induced during a device separation. If the dicing tab is located longer than 100 micrometers from the edge, the available area for each semiconductor device is reduced. Accordingly, in this embodiment, it is preferable to set the gap from the dicing tab to the edge of the surface protective film 6 to be in a range of from 10 to 100 micrometers in order to improve the yield of the semiconductor devices 13. Incidentally, an aluminum pad 7 not shown is actually disposed under an end portion of the redistributing wire 4.

According to the above-mentioned semiconductor device structure, the stress relaxation layer 5 exists between the redistributing wire 4 and the wafer 9. Accordingly, strain of the bump 1 induced by the evolved heat can be spread when each semiconductor device 13 bonded onto the circuit substrate 14 operates. Hence, the lifetime of bonding of the semiconductor device 13 can be elongated even in the case where the semiconductor device 13 is mounted on the circuit substrate 14 without application of underfill 15. Moreover, because the stress relaxation layer 5 has a gentle inclined portion, there is no bent along the redistributing wire 4 which a stress should concentrated at.

Figure 3:
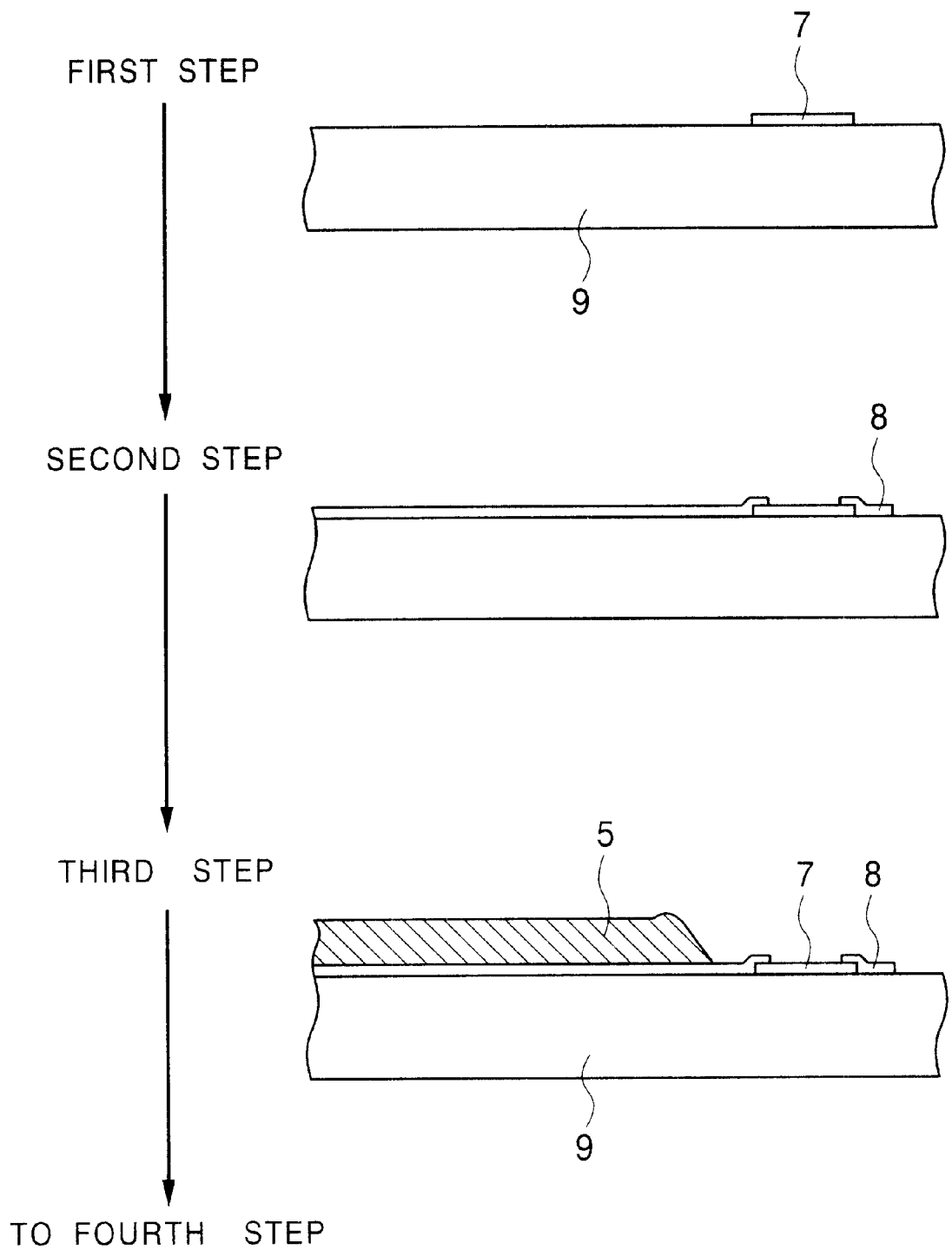
FIG. 3 is a view showing a part of an example of a fabrication process of a semiconductor device according to the present invention.
Figure 4:
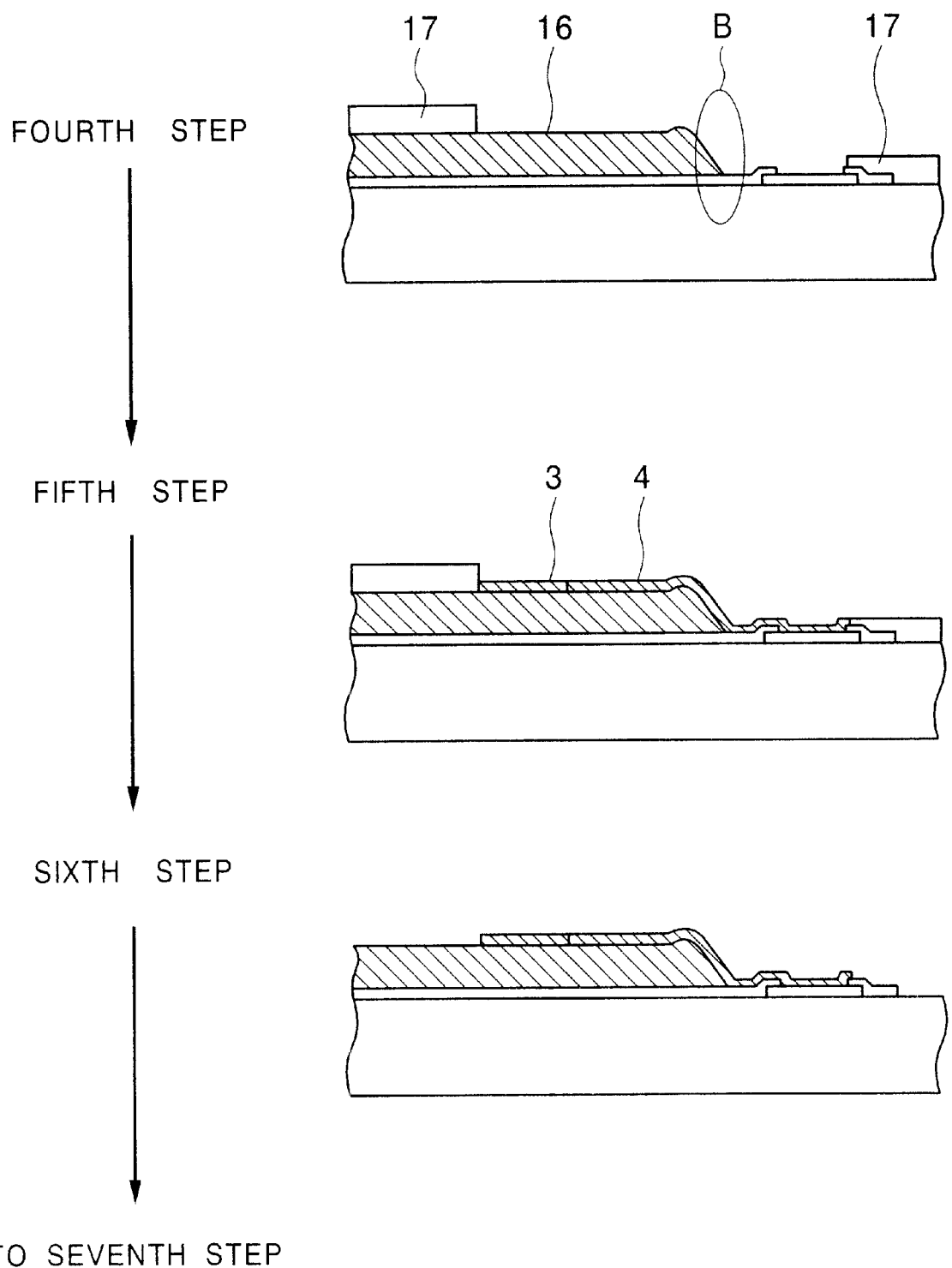
FIG. 4 is a view showing another part of the example of the process of producing a semiconductor device according to the present invention.
Figure 5:
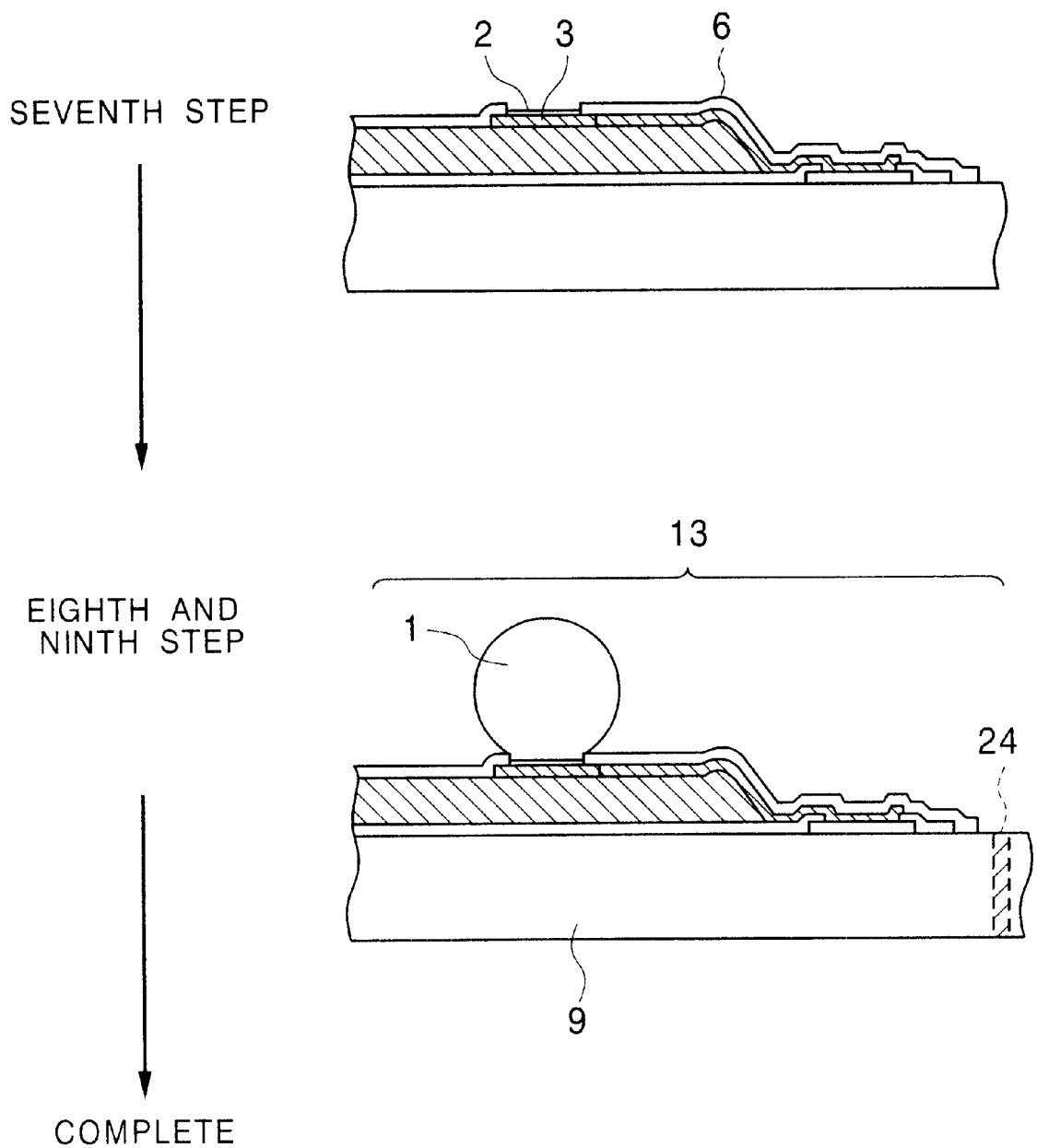
FIG. 5 is a view showing a further part of the example of the process for producing a semiconductor device according to the present invention.

An example for the fabrication process of the semiconductor device 13 in this embodiment will be described below with reference to the drawings. FIG. 3 shows first, second and third steps. FIG. 4 shows fourth, fifth and sixth steps. FIG. 5 shows seventh, eighth and ninth steps. Incidentally, each of the drawings is a sectional view showing only a part to facilitate the understanding of the sectional structure of the semiconductor device 13 in this embodiment.

First Step:

The wafer 9 having semiconductors with aluminum pads 7 for external connection is produced by the same steps as the convetional semiconductor device 13. Although the material of the external connection pad in the semiconductor device used in this embodiment is aluminum, the external connection pad may be made of copper. This is because the external connection is not wire-bonded in this embodiment so that it is not a matter of concern about the bonding trouble on a copper made external bonding pad. If the external connection pad is made of copper, the electric resistance of the wiring can be reduced. Hence, copper is preferable for the external connection pad also from the viewpoint of improvement in electrical characteristic of the semiconductor device.

Figure 13:
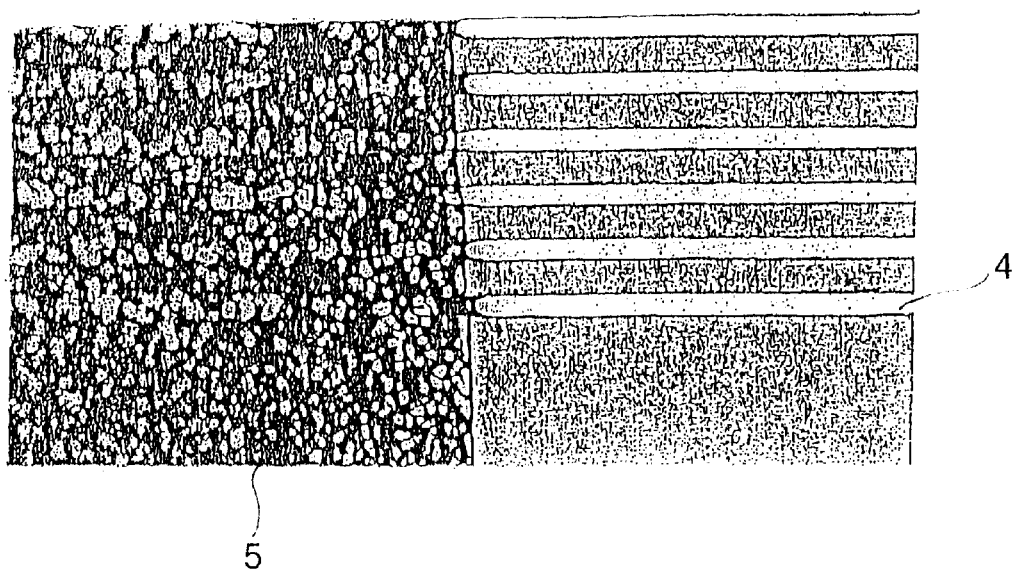
FIG. 13 is a view showing imperfect development in an actual redistributing wire pattern.

Second Step:

A protective film 8 is formed as occasion demands. The protective film 8 may be formed of an inorganic material in advance in a so-called FEOL in a semiconductor producing process. Alternately, the protective film 8 may be formed in a composite layer of an inorganic material and an organic material formed on the inorganic material. In this embodiment, a protective film 8 about 6 micrometers thick is formed as follows. An electrically insulating film is made of an inorganic material in a so-called FEOL in a semiconductor producing process. For example, the electrically insulating film is made of silicon nitride prepared by a CVD method, or the like; silicon dioxide prepared from tetraethoxysilane, or the like; or a composite film thereof. Photosensitive polyimide as an organic material is applied onto the inorganic electrically insulating material, exposed, developed and cured to thereby form a protective film 8 about 6 micrometers thick. Hence, the protective film 8 is formed on the wafer 9 having semiconductors formed thereon. Although this embodiment shows a case where the thickness of the protective film 8 is 6 micrometers, the required thickness varies in accordance with the kind of the semiconductor device and is set to be in a range of from about 1 to about 10 micrometers. Incidentally, it is a matter of course that the organic film may be formed so as to cover approximately the whole surface of the inorganic film as shown in FIG. 13. Alternately, the organic film may be formed only in a region near the aluminum pad 7 as shown in FIGS. 33 to 35. When the electrically insulating film is made of an inorganic material alone, the thickness of the film is selected to be not larger than 3 micrometers. Besides photosensitive polyimide, in this embodiment, polybenzoxazole, polybenzocyclobutene, polyquinoline, polyphosphasen, etc. may be used.

Third Step:

A paste-like polyimide material is printed on a portion where a stress relaxation layer 5 will be formed. Then, the printed polyimide material is heated and cured. Thus, the stress relaxation layer 5 is formed on the protective film 8.

Fourth Step:

An electric power supply film 16 to be used for electroplating is formed by a method such as sputtering. Then, a reverse pattern 17 for wiring is formed by use of a photoresist.

Fifth Step:

An electroplating is performed by use of the electric power supply film 16 and the reverse pattern 17 for wiring. Thus, a redistributing wire 4 and a bump pad 3 are formed. As occasion demands, the electroplating may be repeated so as to form the redistributing wire 4 into a multilayer structure.

Sixth Step:

The reverse pattern 17 for wiring of the photoresist and the electroplating power supply film 16 are removed by etching.

Seventh Step:

A surface protective film 6 is formed of a solder resist. An electroless gold plating 2 is applied onto the outermost surface of the bump pad 3 by use of this pattern.

Eighth Step:

A solder ball is placed together with flux on the bump pad 3 and heated so as to be bonded to the bump pad 3. Thus, a bump 1 is formed.

Ninth Step:

The wafer 9 having semiconductors formed thereon is cut into individual semiconductor devices 13 by a wafer dicing technique.

The procedure from the third step to the eighth step will be described below in detail.

Figure 6:
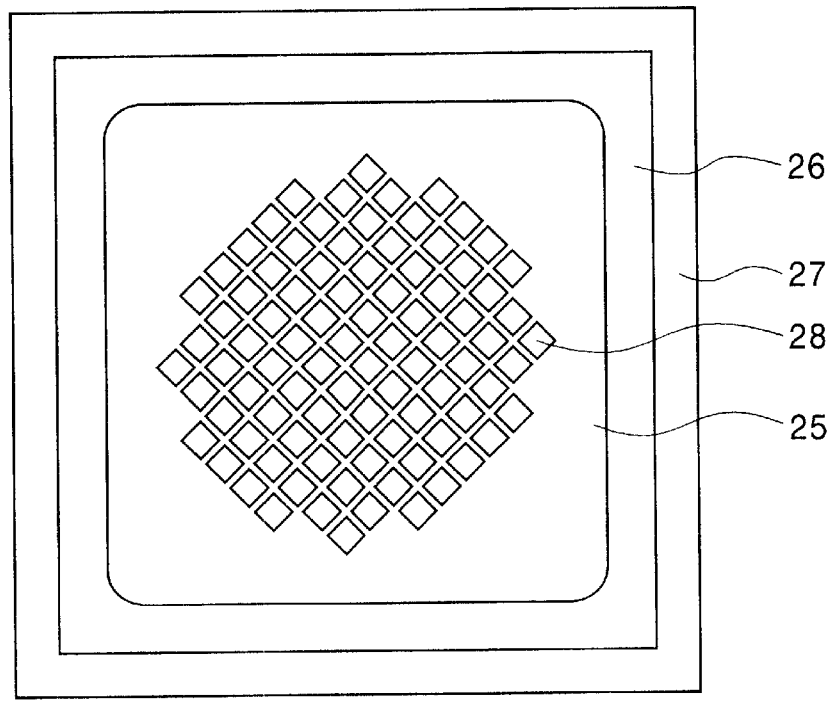
FIG. 6 is a view showing a print mask used for forming a stress relaxation layer in the present invention.
Figure 7:
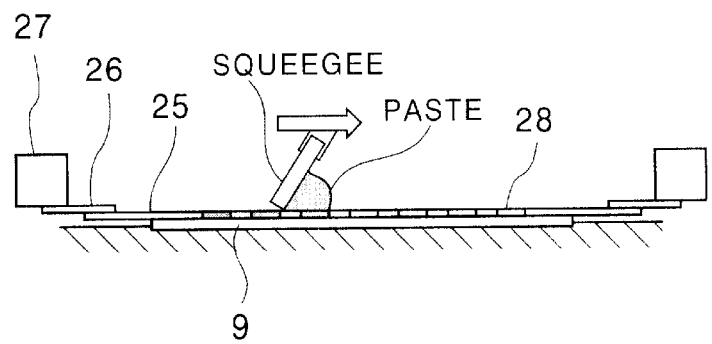
FIG. 7 is a view showing a process for printing a stress relaxation layer.
Figure 8:
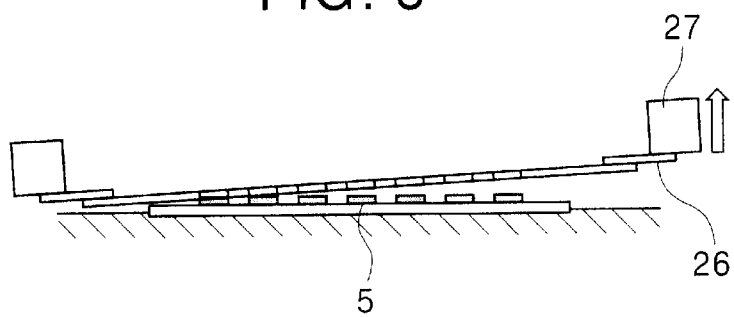
FIG. 8 is a view showing a releasing process in which the print mask is lifted up from the wafer.

The third step will be described first. A mask used for printing may have the same structure as that of the print mask for printing a solder paste etc. on a printed wiring board. For example, as shown in FIG. 6, a metal mask of a combination in which a stencil 25 of a nickel alloy is stuck to a frame 27 through the intermediary of a resin sheet 26 can be used. Because the paste is spread out by about 50 micrometers after printing, a pattern opening portion 28 of the print mask may be formed to be small correspondingly to the area of the spread paste. A paste printing is performed as shown in FIG. 7. That is, the print mask and the pattern of the wafer 9 having semiconductors formed thereon are brought into contact with each other in an aligned state aligned. In this state, a squeegee moves on the stencil 25 to thereby fill the pattern opening portion 28 with the paste. Then, the print mask is lifted up relative to the wafer 9 having semiconductors formed thereon. So-called contact printing is performed in the aforementioned manner. Incidentally, the contact between the wafer and the print mask does not always mean that there is no screen gap between the two. Actually, it is practically difficult to stick the print mask onto the wafer without any screen gap because the protective film 8 has been already partially formed on the wafer. In this embodiment, printing is performed under a print condition such that the screen gap between the wafer and the print mask is selected to be in a range of from 0 to 100 micrometers. Alternately, another printing method may be used as follows. The whole squeegee surface of the print mask is coated with the paste by the first squeegeeing. Then, the pattern opening portion 28 of the print mask is filled with the paste by the second squeegeeing and an excess of the paste is removed. Then, the print mask is lifted up relative to the wafer 9 having semiconductors formed thereon. The print mask may be lifted up vertically to the wafer 9 or, as shown in FIG. 8, the print mask may be lifted up with an inclination angle relative to the wafer 9. Under prerequisite of such an inclined release angle, it is easy to accomplish the uniformity of the angle for the print mask from the wafer. Moreover, because the print mask is released from one end of the wafer toward the other end of the wafer, the final release which is often unstable is carried out on an area where no semiconductor device is formed. Hence, this is advantageous also in terms of improvement in the yield. Further, when printing is performed continuously on a plurality of wafers by use of one printing machine, the step of wiping the rear side of the mask plate at suitable period may be preferably inserted. For example, in this embodiment, the rear side of the mask plate is cleaned every 10 continuous wafers. That is, printing is performed on the eleventh wafer after cleaning. The period, the number of times and the method for cleaning the rear side of the mask need be adjusted suitably in accordance with the viscosity of the paste material, the concentration of non-volatile in the paste material, the amount of filler in the paste material, etc.

Then, the wafer 9 on which semiconductors are formed and the paste is printed is heated step by step on a hot plate or on a heating furnace to thereby cure the paste. Thus, the formation of the stress relaxation layer 5 is completed.

The material used for forming the stress relaxation layer 5 is polyimide paste, which can be cured during a heat after printed on the protective film 8. The polyimide paste contains a polyimide precursor, a solvent, and a large number of polyimide fine particles dispersed in the solvent. Specifically, the fine particles used here are fine particles having a particle size distribution exhibiting a mean particle size in a range of from 1 to 2 micrometers and a maximum particle size of about 10 micrometers. When cured, the polyimide precursor used in this embodiment forms the same material as that of the polyimide fine particles. Hence, when the polyimide paste is cured, a homogeneous stress relaxation layer 5 of one kind of material is formed. Although this embodiment has shown the case where polyimide is used as the material for the stress relaxation layer, this embodiment may be applied also to the case where any resin other than polyimide such as an amide-imide resin, an ester-imide resin, an ether-imide resin, a silicone resin, an acrylic resin, a polyester resin, modified resins of the above resins, etc. may be used. When any resin other than polyimide is used, it is preferable that the surfaces of the polyimide fine particles are treated to have compatibility with the resin other than polyimide or the resin composition is modified to improve affinity with the polyimide fine particles.

Among the above-listed resins, resins having imide bonds, such as polyimide, amide-imide, ester-imide, ether-imide, etc., are excellent in heat mechanical characteristic such as strength at a high temperature because the resins have strong skeletons formed by imide bonds. As a result, the method of forming a plating power supply film for wiring can be selected from various methods. For example, a method of forming a plating power supply film by a high-temperature process such as sputtering can be selected. Resins, such as a silicone resin, an acrylic resin, a polyester resin, an amide-imide resin, an ester-imide resin and an ether-imide resin, having portions condensed by bonds other than imide bonds are slightly inferior in heat mechanical characteristic but may be advantageous in terms of processability, resin cost, etc. For example, a polyester-imide resin is easy to handle because the curing temperature of polyester-imide is generally lower than that of polyimide. In this embodiment, these resins are used suitably and selectively in overall consideration of device characteristic, cost, heat mechanical characteristic, etc.

The viscoelasticity of the material can be adjusted by dispersion of polyimide fine particles in polyimide paste. Thus, a paste excellent in printability can be used. The thixotropy of the paste can be controlled by adjustment of the mixture proportion of the fine particles. Hence, printability can be improved by adjustment of the blend proportion in combination with adjustment of viscosity. Moreover, the inclination angle on the edge of the stress relaxation layer 5 can be adjusted. The thixotropy of the paste used in this embodiment is preferably in a range of from 2.0 to 3.0 in terms of so-called thixotropy index obtained on the basis of the ratio of the viscosity measured at a rotational speed of 1 rpm to the viscosity measured at a rotational speed of 10 rpm by using a rotaviscometer. Incidentally, in the case of a paste exhibiting temperature dependence on the thixotropy index, a good result can be obtained when printing is made in such a temperature range that the thixotropy index is selected to be in a range of from 2.0 to 3.0.

Figure 9:
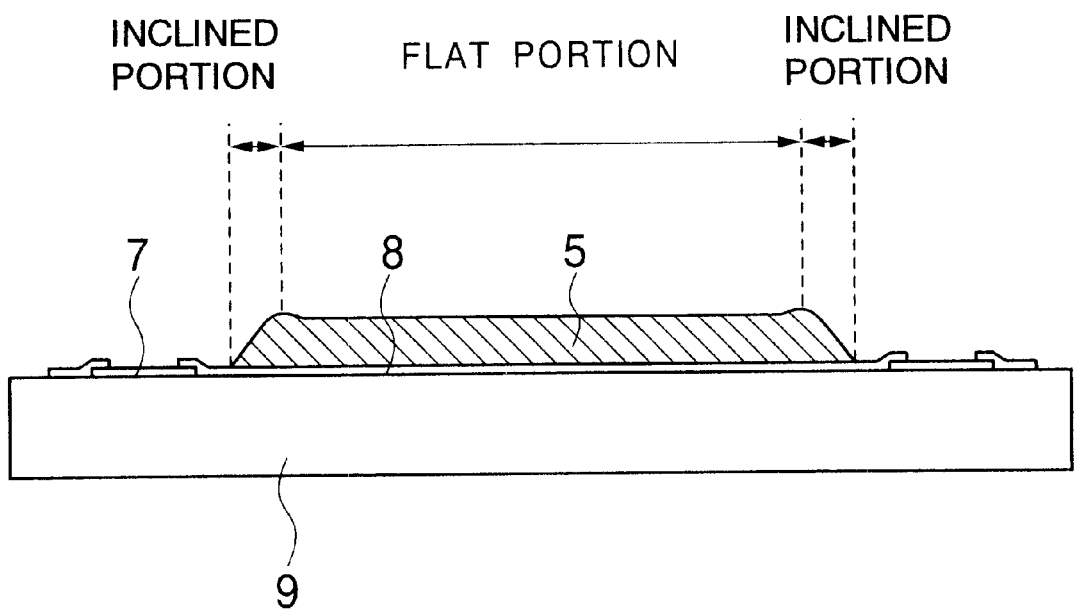
FIG. 9 is a view showing a semiconductor device having a stress relaxation layer formed thereon.

After the printed polyimide paste is heated and cured, a stress relaxation layer 5 having a sectional shape as shown in FIG. 9 is formed on the wafer 9. When the stress relaxation layer 5 is formed by printing in the aforementioned manner, a protrusive portion may appear in a position distanced by 200 to 1000 micrometers from an edge lump of the stress relaxation layer 5. The position and presence/absence of the protrusive portion can be controlled to a certain degree by adjustment of the blend of the polyimide paste and alteration of various conditions concerning printing. Incidentally, in this case, the words "various conditions concerning printing" include metal mask thickness, squeegeeing velocity, squeegee material, squeegeeing angle, squeegee pressure, squeegee release velocity, wafer temperature during printing, moisture during printing environment, etc.

Figure 36:
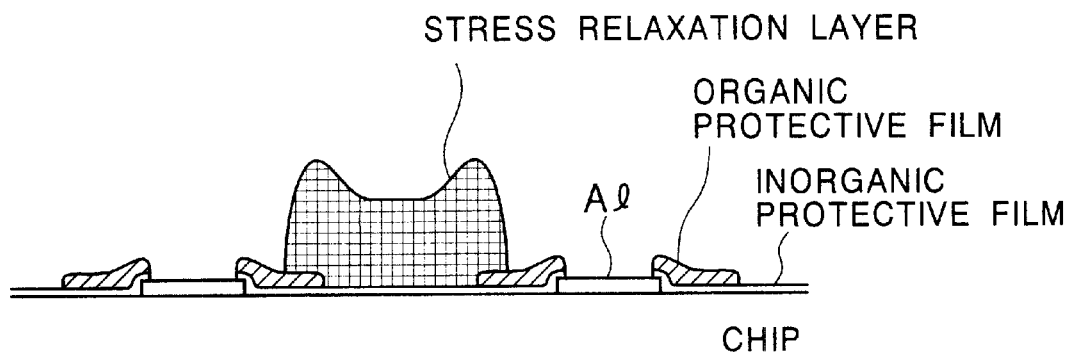
FIG. 36 is a view showing a further embodiment of the structure of the semiconductor device according to the present invention.

Although the height and shape of the protrusive portion can be controlled under the above-mentioned printing conditions, adjustment of the shape of the protective film 8 may serve other control methods. For example, if the organic layer-forming region of the protective film 8 is limited to a region near the pad 7 as shown in FIG. 36, it is easy to protrude the stress relaxation layer at a portion corresponding to the upper portion of the organic layer.

Further, a protrusive portion which is formed intentionally in the stress relaxation layer 5 as shown in FIG. 1 affords a flexible portion along the wiring 4. Thus, the aforementioned structure can effectively absorb the stress induced by thermal expansion, etc. so that the wiring 4 can be prevented more greatly from being disconnected. Specifically, it is preferable that a protrusive portion is formed to be higher by about 25 micrometers at maximum, more preferably by 7 to 12 micrometers than the average height of the stress relaxation layer 5. Vertices of the protrusive portion of the aforementioned height can be formed sufficiently by mask printing. Assuming that the protrusive portion is a semicylinder shape with a radius of 10 micrometers, the length of the semicircle of the protrusive portion would be (2×3.14× 10 micrometers)/2=31.4 micrometers. Hence, the redundant length of the wiring is 31.4−10=21.4 micrometers per one protrusive portion. When one swelling portion is formed on each of opposite sides of the stress relaxation layer, the sum redundant length of the wiring is 42.8 micrometers. Because a redundant portion can be provided in the wiring 4 in the aforementioned manner, thermal stress affecting on the wiring structure and the solder junction portion is relaxed. Hence, a highly reliable wiring structure can be obtained. Incidentally, the required thickness of the protrusive portion is determined on the basis of experiment and simulation in consideration of the thickness and elastic modulus of the stress relaxation layer 5, the size of the semiconductor device 13, the electric power consumed by the semiconductor device, the physical properties of the circuit substrate 14 for mounting the semiconductor device thereon, etc. For example, in this embodiment, the maximum quantity of thermal deformation of the wiring portion on the circuit substrate in an actual environment is 15(ppm/° C.)×L/2 (mm)×200(° C.)=0.0015L millimeters when L (mm) is the diagonal length of the semiconductor device 13, the difference between the coefficient of thermal expansion of the semiconductor device 13 and that of the circuit substrate 14 for mounting the semiconductor device 13 thereon is 15 ppm/° C., and the maximum temperature range due to ON/OFF during a process of mounting the semiconductor device 13 on the substrate is 200° C. Hence, it is conceived to be sufficient if the required redundant length of the protrusive portion is about 0.002×L millimeters. In this embodiment, the protrusive portion is looked upon as a semicylindrical shape on the basis of the aforementioned calculation, hence the protrusive portion is higher in a range of from about L/2000 to about L/500 millimeters than the average height of the stress relaxation layer 5.

If the required thickness of the stress relaxation layer 5 cannot be formed by printing and heat-curing by one time, the required thickness can be obtained by repeating printing and material-curing by a plurality of times. For example, a paste having a concentration of non-volatile of from 30 to 40% through a metal mask having a thickness of 65 micrometers yields the stress relaxation layer 5 with the thickness of about 50 micrometers after twice repetition of printing and curing. Particularly with respect to the bump 1 disposed in a position where strain is apt to be concentrated when the semiconductor device 13 is bonded onto the circuit substrate 14, concentration of strain can be relaxed by an increase of the thickness of the stress relaxation layer 5 in a portion corresponding to the position where the bump 1 is disposed. Therefore, for example, metal masks different from that which was used in the first-time printing can be used for printing polyimide paste on the wafer 9 having semiconductors formed thereon.

Figure 37:
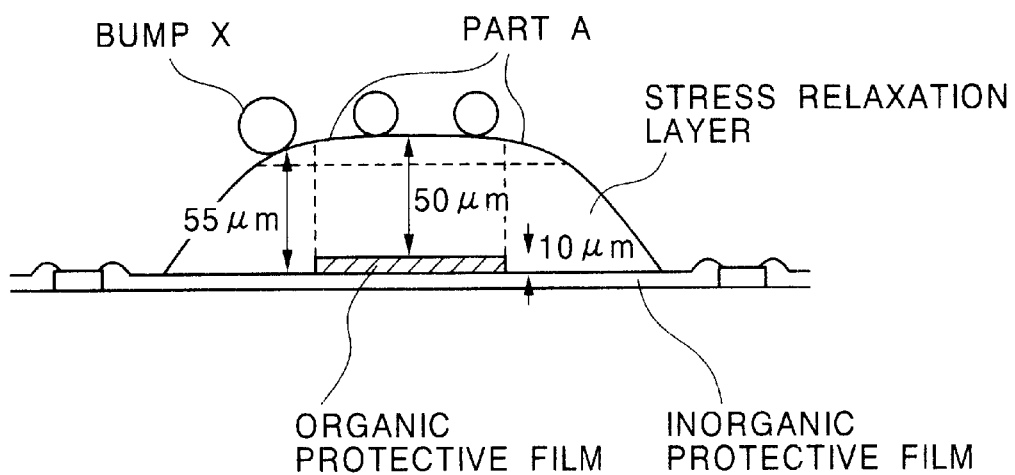
FIG. 37 is a view showing a further embodiment of the structure of the semiconductor device according to the present invention.

Alternately, as a second method, adjustment of the shape of the protective layer 8 may afford a partial change of the thickness of the stress relaxation layer. As shown in FIG. 37, for example, a protective film is formed so that a protective layer of an inorganic film is used only in a region just under the bump X in which strain is apt to be concentrated whereas a composite layer composed of an inorganic film and an organic film formed on the inorganic film is used in the other region. When the stress relaxation layer is formed on the aforementioned protective film, a gentle inclined portion of the stress relaxation layer is formed on an edge A between where the organic protective film is contained in the protective film and where the organic protective film is not contained.

Assuming that the stress relaxation layer has a thickness of 50 micrometers and an elastic modulus of 1 GPa and the organic film in the protective film has a thickness of 10 micrometers and an elastic modulus of 3 GPa, the average elastic coefficient (GPa/$\mu$m) of a portion where the organic protective film and the stress relaxation layer are located becomes $(3\times10+1\times50)/60\approx1.3$. On the other hand, the average elastic coefficient of the inclined portion in the portion A is 1. In such a structure, thermal stress on the stress relaxation layer is spread from the peripheral portion into the portion where the organic protective film is formed. Hence, the bump disposed in the peripheral portion where thermal stress is apt to be otherwise concentrated can be prevented from being broken.

Incidentally, the stress relaxation layer need not always contain fine particles. If viscoelasticity can be kept at minimum required for printing, fine particles are not necessary to be dispersed in the paste. When fine particles are not dispersed in the paste, there is, however, a possibility that the margin for various conditions concerning printing may be narrowed extremely.

The fourth step will be described next. In this embodiment, the redistributing wire 4 is provided as two layers consisting of a copper electroplating layer and a nickel electroplating layer. Incidentally, one end of the redistributing wire 4 may serve also as a bump pad 3. Although this embodiment has shown the case where both copper and nickel are electroplated so as to form an electrical conductor, electroless plating is also applicable to the present invention.

First, an electric power supply film 16 for performing electroplating is formed on the whole surface of the semiconductor wafer. Although evaporation, electroless copper plating, CVD, or the like, may be used here, sputtering excellent in adhesion to the protective layer 8 and to the stress relaxation layer 5 is used in this embodiment. As a pre-process of sputtering, a sputter etching is performed for keeping current conduction between the bonding pad 7 and the electrical conductor of the redistributing wire 4. In this embodiment, a multilayer film of chromium (75 nm)/copper (0.5 $\mu$m) is formed as a sputtered film. The function of chromium here is to keep adhesion between copper and the stress relaxation layer, or the like, located above and under the chromium. The film thickness of chromium is preferably selected to be as small as possible but sufficient to keep the adhesion. If the film thickness of chromium is large, a great deal of time is required to form the film. Hence, a problem would appear on a lowered productivity. In addition, the protective layer 8 and the stress relaxation layer 5 are exposed to high-energy-state plasma produced in a sputtering chamber for a long time. Hence, there would arise a risk that materials of the protective layer 8 and the stress relaxation layer 5 may be spoiled. Incidentally, although the required film thickness of chromium varies also in accordance with the sputter etching and sputtering conditions, the film quality of chromium, etc, the thickness is generally 0.5 micrometers at maximum. Incidentally, the chromium film used in this embodiment may be replaced by a titanium film, a titanium/platinum film, tungsten, or the like. On the other hand, it is preferable that thickness of the sputtering copper is selected to be minimum so that no film thickness distribution of a plating film is generated, when the copper electroplating and the nickel electroplating are performed in a post-process. That is, the film thickness is determined also in consideration of the quantity of reduction of the film owing to acid washing, etc., performed as a pre-process of plating so that it does not induce the film thickness distribution. If the film thickness of sputtering copper is made larger than required, for example, larger than 1 micrometers, the sputtering time is elongated so as to cause a problem that productivity is lowered. In addition, it is inevitable that it takes a long time to remove the power supply film 16 by etching which will be performed as a post-process. As a result, a side etching of the redistributing wire 4 is made large. In a simple calculation, an etching of a power supply film 1 micrometer thick is accomplished with side etch at each side of the wire is also etched by 1 micrometer, that is, the opposite sides of the wire are etched by 2 micrometers in total. In the actual production, an overetching is generally performed to avoid imperfect etching of the power supply film. Hence, when a power supply film 1 micrometer thick is etched, the wire is actually side-etched by about 5 micrometers. If the side etching is made so large, a problem is apt to happen in the viewpoint of wiring performance because wiring resistance is apt to increase or because wire breakage is apt to be induced. Therefore, the film thickness of sputtering copper is selected to be 1 micrometer at maximum approximately.

Then, a reverse pattern shape 17 to the redistributing wire 4 is formed by using a resist with a photolithography technique. The resist in the edge portion of the stress relaxation layer 5 as represented by the area B in FIG. 4 is thicker in comparison with that in the other portion because of the resist coming down from the inclined portion in comparison with that in the other portion. Hence, a negative type resist is preferably used for keeping resolution high. If a liquid resist is used as the resist, the resist is apt to be thinner on the upper portion of the inclined surface on the edge of the stress relaxation layer 5 as represented by the area B in FIG. 4 and, on the other hand, the resist is apt to be thicker on the lower portion of the inclined surface. Hence, a wide developing margin with respect to the film thickness is required for patterning the resist different in film thickness between the upper portion and the lower portion on the inclined surface in the same quantity of exposure and under the same developing condition. Generally, a developing margin of a negative type photosensitive resist is wider with respect to thickness than that of a positive type photosensitive resist. Therefore, a negative type photosensitive liquid resist is used in this embodiment. Incidentally, when a film resist is to be used, either negative type resist or positive type resist can be used because there is no film thickness difference produced between the upper and lower portions of the inclined surface. However, a negative type resist often afford a good result because the inclined portion is exposed so obliquely that the effective optical path length is elongated. When the inclination angle of the edge portion of the stress relaxation layer 5 is large or when a film resist having weak bleaching characteristic is used, a negative type resist is particularly preferably used.

Figure 10:
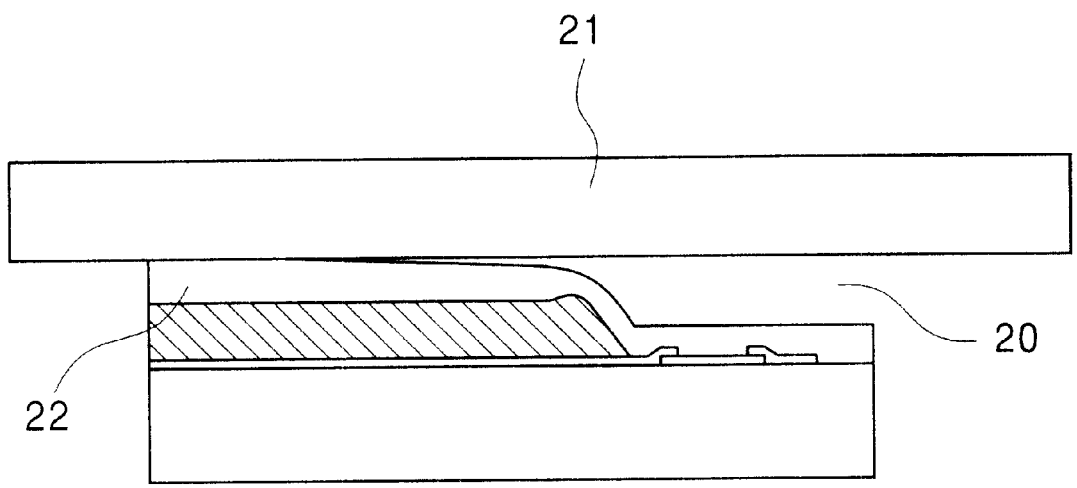
FIG. 10 is a view showing a state in which an exposure mask is stuck closely to a resist.

In this embodiment, there is used an exposure machine of the type in which an exposure mask 21 and a resist 22 contact to each other but a screen gap 20 is partially formed as shown in FIG. 10. The resolution limit of the exposure machine was about 10 micrometers when the exposure mask 21 and the resist 22 contact to each other. According to the experimental result by the present inventors, the relationship between the screen gap 20 below the exposure mask 21 and the line width to be subject to resolution was as shown in Table 1. Incidentally, values in Table 1 vary in accordance with the optical system of the exposure machine, the developing condition, the sensitivity of the resist, the resist curing condition, the ratio of the line width to the line space, etc.

The experimental result in Table 1 shows values in the case where the ratio of the line width to the line space is 1.0.

TABLE 1

|  | | Screen Gap below Exposure Mask [μm] | | |
|---|---|---|---|---|
|  |  | 40 | 60 | 80 |
| Line Width [μm] | 15 | X | X | X |
|  | 20 | ○ | X | X |
|  | 25 | ○ | ○ | ○ |
|  | 30 | ○ | ○ | ○ |
|  | 40 | ○ | ○ | ○ |
|  | 50 | ○ | ○ | ○ |

○: Resolution was possible.
X: Resolution was impossible.

Figure 11:
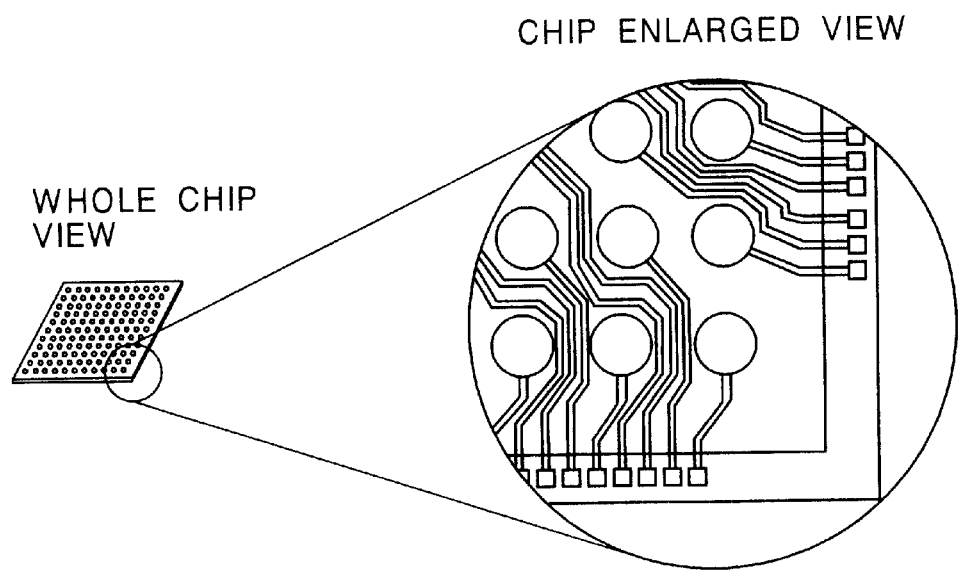
FIG. 11 is a view showing an example of redistributing wire.

FIG. 11 shows a state in which a connection portion 23 to the aluminum pad and the bump pad 3 are connected through the redistributing wire 4. In the case of the exposure machine used in this embodiment, the screen gap below the exposure mask as shown in the column of Table 1 approximately corresponds to the thickness of the stress relaxation layer. Hence, for example, at the 60 micrometers thick stress relaxation layer, resolution will be possible up to 25 micrometers in terms of the line width. Hence, wiring may be made so that the line width of a signal line is 25 micrometers and the line width of a power or ground line is 40 micrometers. Alternately, wiring may be made so that the line width of a signal line is 25 micrometers but partially thickened.

Figure 12:
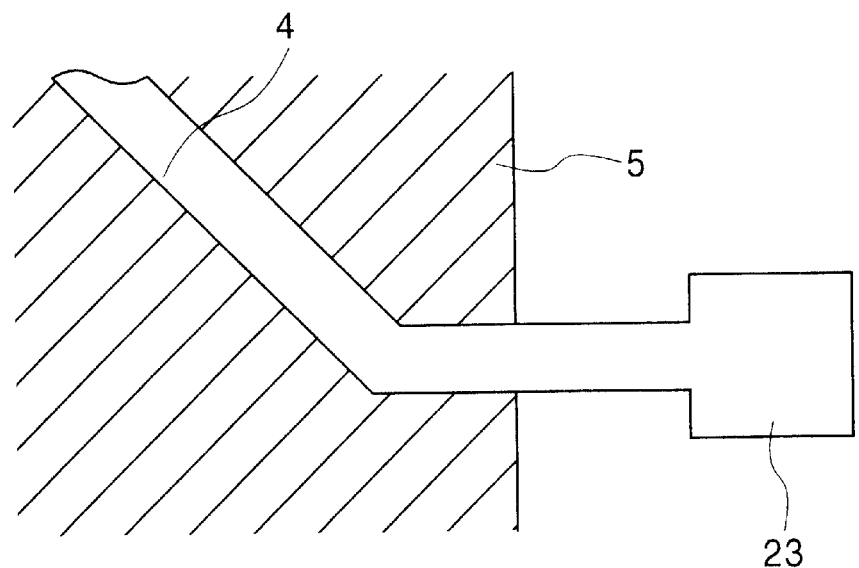
FIG. 12 is a view showing another example of redistributing wire.

FIG. 12 is an enlarged view of the redistributing wire 4 in the vicinity of the inclined portion of the stress relaxation layer 5. As described above, the film thickness of the resist becomes uneven in an area near the edge portion of the stress relaxation layer 5. Hence, there is a tendency that failure of developing is apt to happen in the area. FIG. 13 shows a state in which failure of developing actually happens in the edge portion of the stress relaxation layer 5. In this embodiment, the circulation of a developing solution is improved to thereby solve this problem of imperfect developing. To illustrate more specifically, measures to change the wiring pattern shape as shown in FIG. 14 or 15 may be taken.

Figure 14:
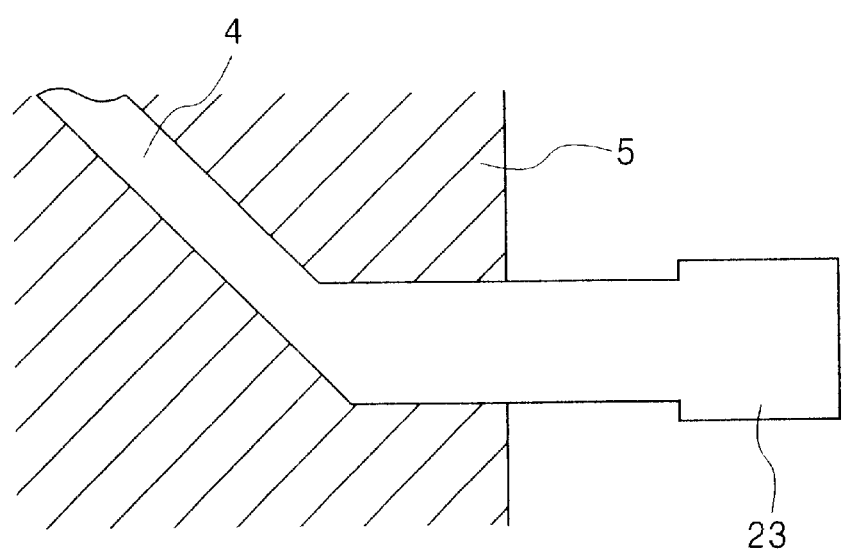
FIG. 14 is a view showing a further example of redistributing wire.
Figure 15:
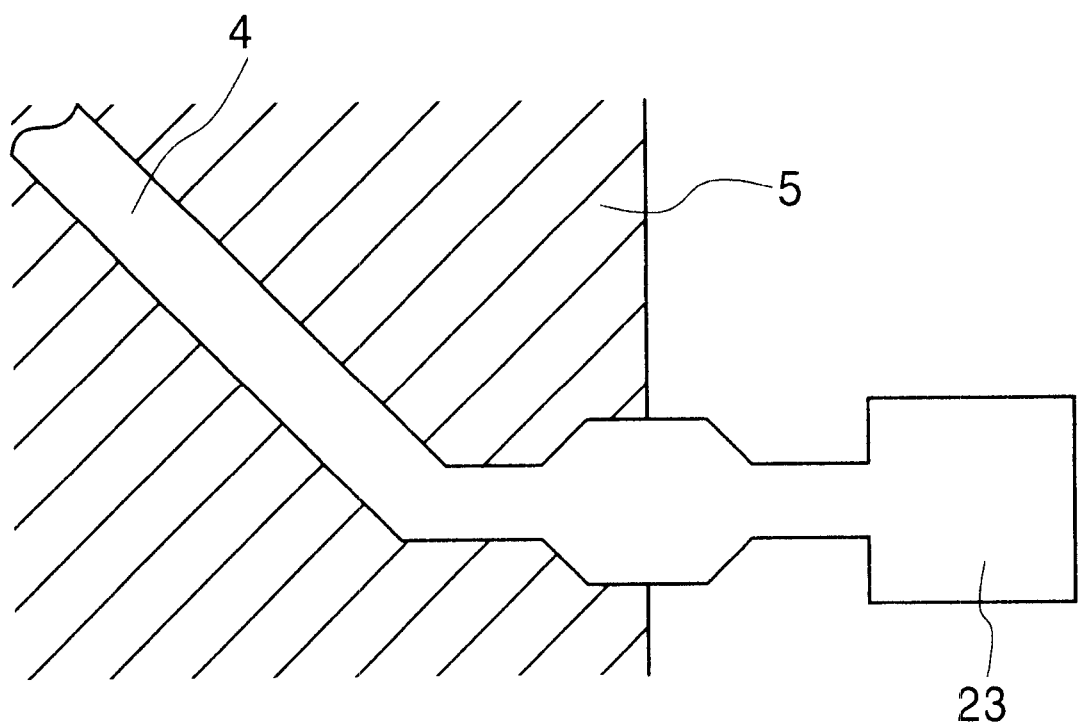
FIG. 15 is a view showing a further example of redistributing wire.

FIG. 14 shows the case where the line width is thickened in an area of from the connection portion 23 with the aluminum pad to a place near a vertex of the stress relaxation layer 5. FIG. 15 shows the case where the line width is thickened only in the edge portion of the stress relaxation layer 5 which is apt to be low in resolution. Incidentally, the line width in FIGS. 14 and 15 is determined in consideration of the thickness of the stress relaxation layer 5 and the resolution characteristic shown in Table 1. As another measure to solve the problem of imperfect developing, it seems that a method of elongating the developing time to thereby eliminate imperfect developing. Further, because light is diffracted at the mask surface, lowering of resolution or lowering of patterning accuracy may be induced by the presence of the screen gap 20 under the exposure mask 21.

Examples of measures to eliminate the above phenomenon include (1) alteration of the optical system in the exposure machine, (2) improvement in bleaching characteristic of the resist, (3) optimization of the pre-baking condition of the resist, (4) multistageous exposure, and so on. As a specific example of alteration of the optical system in the exposure machine, a measure uses an exposure machine having a numerical aperture value in a range of from 0.0001 to 0.2. Besides the aforementioned examples, known arrangements on process may be used suitably in combination so that patterning resolution and patterning accuracy can be improved.

Figure 16:
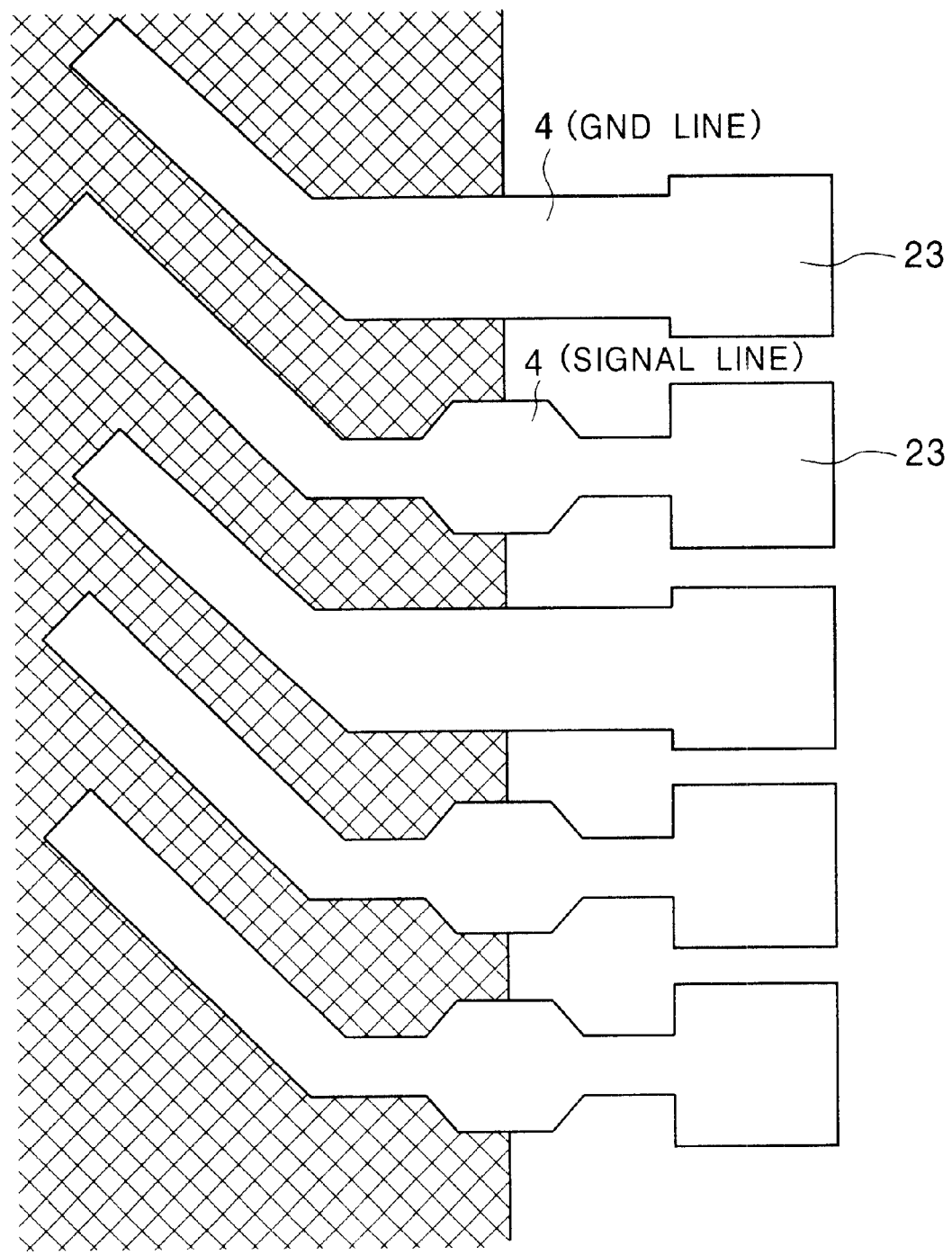
FIG. 16 is a view showing a further example of redistributing wire.

The edge portion of the stress relaxation layer 5 has structural characteristics in that stress induced by difference in physical values between the wafer and the stress relaxation layer 5 is concentrated into the edge portion of the stress relaxation layer 5. Therefore, the line width in the inclined portion of the stress relaxation layer 5 may be thickened to effectively prevent the line from being broken. Incidentally, all the line width need not always be made equal. For example, as shown in FIG. 16, the line width of a power/ground line and the line width of a signal line may be made different from each other. In this case, it is generally preferable that the width of the power/ground line is thickened greater than that of the signal line in terms of electrical characteristics. This is because an increase in width of the signal line brings increase of the capacitance component of the line to thereby exert a bad influence in a high-speed operation. On the other hand, thickening in width of the power/ground line is preferably expected to bring an effect of stabilizing a power supply voltage. Hence, as shown in the drawings, it is preferable that the signal line is provided as such a shape that the width of the signal line is thickened around the edge portion to relax the stress in the portion suffering concentration of stress as large as possible whereas the width of the power/ground line is provided as such a shape that the width of the power/ground line is thickened uniformly in the inclined portion. On the other hand, on the flat portion in which the stress relaxation layer is not formed, the width of the signal line is thinned in consideration of the influence of the capacitance component of the line. The line width is, however, necessary to be considered again whenever the kind of the semiconductor device or the line pattern thereof is changed. An increase of the thickness of the protective film 8 has a great effect of reducing the capacitance of the line though the effect also depends on the kind of the semiconductor device and the line pattern thereof. When, for example, the width of the signal line cannot but be thickened in the flat portion in which the stress relaxation layer is not formed, it is preferable that the protective film 8 is thickened. Specifically, when the line width is increased by 10%, it is preferable that the thickness of the protective film 8 is also increased by about 10%. On the other hand, the line width in the flat portion above the stress relaxation layer is limited by the line density rather than the signal line capacitance. That is, the upper limit value of the line width in the flat portion above the stress relaxation layer is determined on the basis of the number of lines to pass through the interval between bump pads, the diameter of each bump pad, the positioning accuracy in the line-forming process, etc. To illustrate specifically, when three lines are to be drawn between bump pads which are disposed at an interval of 0.5 millimeters and each of which has a pad diameter of 300 micrometers, the upper limit value of the line width is calculated as (500−300)/(3×2−1)=40. From a result of the calculation, the average line width and the line space in this embodiment are selected to be 40 micrometers.

The fifth step will be described below. In this embodiment, copper plating is performed by use of a copper sulfate plating solution. Copper electroplating is performed under the condition that the power supply film 16 is connected to a cathode and a copper plate containing phosphorus is connected to an anode after cleaning with a surface active agent, washing with water, cleaning with dilute sulfuric acid and washing with water.

Nickel electroplating is performed next. Incidentally, if cleaning with a surface active agent, washing with water, cleaning with dilute sulfuric acid and washing with water are performed before nickel electroplating, there is a tendency that a nickel electroplating film excellent in film quality can be obtained easily. Nickel electroplating is performed under the condition that the power supply film 16 is connected to a cathode and a nickel plate is connected to an anode. Known nickel plating bath such as a Watts type bath or a sulfaminic acid type bath can be used for nickel electroplating adapted for the embodiment. In this embodiment, plating is performed in a Watts type bath under the plating condition that the internal stress of the plating film is adjusted to be in a proper range. The sulfaminic acid type bath has an advantage that stress of the resultant plating film can be controlled easily while it has, at the same time, a disadvantage that a plating liquid composition is expensive and shows a tendency to be decomposed slightly easily in comparison with the Watts type bath. On the other hand, because the stress of the plating film in the Watts type bath is generally apt to become high, the Watts type bath has a disadvantage that a risk of cracking of the wiring layer is increased due to stress (tensile stress) of the resultant plating film per se when thick-film plating is performed. Although the Watts type bath is used in this embodiment, it is preferable that a model experiment is performed in advance in order to obtain proper ranges of the kind and concentration of additives (plating film stress suppressor), the plating current density and the plating solution temperature before the Watts type bath or the sulfaminic acid type bath is used to perform Nickel electroplating. In this embodiment, Nickel electroplating is performed after the condition that these proper ranges are controlled suitably to prevent the line from cracking with the film thickness of not larger than 10 micrometers is obtained in advance.

Incidentally, the plating film stress is one of indices concerning metal crystal direction of deposited nickel. It is necessary to control the plating film stress properly in order to suppress the growth of an interfacial intermetallic layer which will be described later. When plating is performed under the condition that the film stress is controlled properly, specific amounts of trace components are co-deposited in the plating film. For example, in the case of a film containing of sulfur in a range of from 0.001 to 0.05%, the content of specific crystal oriented faces is increased. More specifically, the total content of oriented faces 111, 220, 200 and 311 is increased to be not smaller than 50%.

The optimum value of the thickness of the nickel electroplating film is determined in accordance with the kind of solder and the reflow condition to be used in a post-process, and the characteristic (the structure of the assembled module) of a semiconductor device. Specifically, the optimum value may be determined so that the thickness of an alloy layer which is formed of solder and nickel at the time of solder reflow or mounting repair is not larger than the thickness of the nickel plating film. The thickness of the alloy layer increases as the concentration of tin in solder increases. Besides, the thickness of the alloy layer increases as the upper limit in reflow temperature increases.

When the nickel layer is formed on a copper wire as the redistributing wire in the aforementioned manner, the redistributing wire is deformed due to thermal stress acting between the semiconductor device and the circuit substrate. When the stress is released thereafter, the deformed shape of the redistributing wire can be restored to its original state by spring characteristic of the nickel layer.

For example, the stress relaxation layer and the redistributing wire 4 formed on the stress relaxation layer are deformed due to the action of thermal stress induced by an operation of the semiconductor device in the state in which the stress relaxation layer is in close contact with the redistributing wire 4. The flexible portion in the redundant portion of the redistributing wire disposed in the protrusive portion of the stress relaxation layer is used for the deformation of the redistributing wire. If the redistributing wire is constituted by a copper wire alone, the deformed shape of the copper wire is hardly restored to its original state by spring characteristic of the copper wire per se when the deformed shape of the stress relaxation layer is released from the thermal stress, or the like, so as to be restored to its original state after the deformation. On the other hand, if a nickel layer is formed on the copper wire, the deformed shape of the redistributing wire (copper wire) can be easily restored to its original state by spring characteristic of the nickel layer. Incidentally, the layer formed on the copper wire is not limited to the nickel layer. Any layer may be used so long as the layer can exhibit spring characteristic to the similar degree as that of the nickel layer formed on the copper wire. In addition, the nickel layer is not always required if the copper wire is replaced by a flexible wire.

In the sixth step, the resist 17 to be a reverse pattern to the wiring is removed after copper electroplating and nickel electroplating are performed. Then, etching is performed to remove the power supply film 16 formed in advance.

An etchant such as a ferric chloride solution or an alkaline type solution, may be used for etching copper. In this embodiment, an etchant containing sulfuric acid/hydrogen peroxide as the main components was used. If the etching time is shorter than 10 seconds, there is a disadvantage from the viewpoint of practical use because etching can hardly be controlled. If the etching time is too long, for example, longer than 5 minutes, there is a problem that side etching is made large or a design cycle time is made long. Hence, it is preferable to select the etchant and the etching condition on the basis of suitable experiments. In this embodiment, the chromium portion of the power supply film 16 is etched next by an etchant containing potassium permanganate and metasilcate as the main components. Incidentally, the nickel electroplating film serves also as an etching resist when the power supply film 16 is etched. Hence, it is preferable that the composition for the etchant and the etching condition are determined in consideration of the etching selection ratios between nickel and copper, and between nickel and chromium. Specifically, for example, it is preferable that the content of sulfuric acid in the sulfuric acid/hydrogen peroxide etchant used for etching copper is selected to be not larger than 50% at maximum, more preferably not larger than 15%. Thus, copper can be etched at an etching selection ratio of about 10 times as large as that for nickel.

In the seventh step, the surface protective film 6 having openings on the bump pad 3, the dicing area 24 and the vicinity of the dividing area is formed. Electoless plating is then performed to thereby form a gold film on the bump pad portion 3. In this step, a solder resist is used as the surface protective film 6. After the solder resist is applied onto the whole surface of the semiconductor device 13, the solder resist is subjected to exposure and development to form a pattern. Any material other than the solder resist such as photosensitive polyimide or printing polyimide may be also used for forming the surface protective film 6.

When the aforementioned steps are completed, the redistributing wire 4, the stress relaxation layer 5, the protective film 8, etc. are entirely covered with the surface protective film 6. Hence, the surface protective film 6 can prevent the redistributing wire 4, the stress relaxation layer 5 and the protective film 8 from being spoiled, peeled and corroded by stimulant substances.

Figure 17:
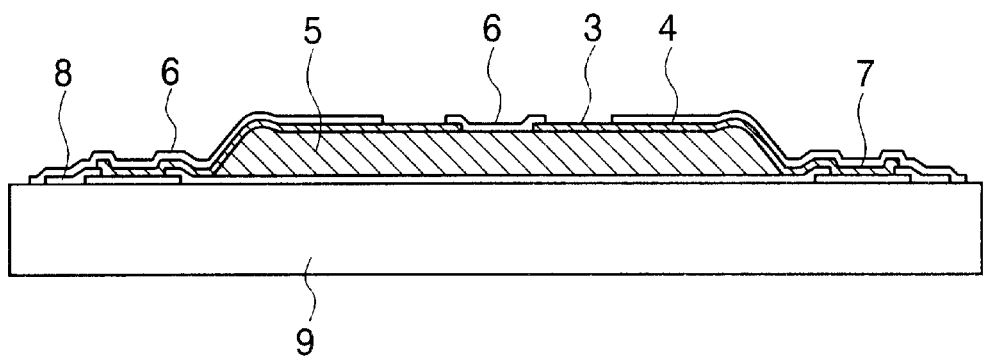
FIG. 17 is a view showing a semiconductor device after the seventh step is performed in the present invention.

When the seventh step is completed, the redistributing wire 4 in an area from the aluminum pad 7 to the bump pad 3 and the bump pad 3 are formed on the wafer 9 having semiconductors formed thereon, as shown in FIGS. 17 and 2.

In the eighth step, the bump is formed by use of a solder ball mounting machine and a reflow furnace. That is, one solder ball together with a predetermined amount of flux is mounted on one bump pad 3 by use of the solder ball mounting machine. On this occasion, the solder ball is temporarily fixed onto the bump pad by adhesive power of the flux. When the semiconductor wafer having solder balls mounted thereon is put into the reflow furnace, the solder balls are once melted and then solidified again. As a result, the bump 1 connected to the bump pad 3 is formed as shown in FIG. 1. As another method to form the bump 1, there is a method in which a solder paste is printed on the bump pad 3 by a printing machine and then reflowed to thereby form the bump 1. In the above methods, any suitable material for solder ball can be selected. Hence, most of solder materials available on the market at the present time can be used. As a further method to form the bump 1, there is a method using a plating technique for forming the bump 1 while the solder material used in the method is limited. Alternately, the bump may be formed from a ball containing gold or copper as its core, or, the bump may be formed of a resin mixed with an electrically conducting material.

When the process from the first step to the ninth step is completed, there can be achieved the semiconductor device 13 having the stress relaxation layer 5 shown in FIG. 1 and the redistributing wire 4 formed in a small number of steps without forming any bent portion suffering concentration of stress along the redistributing wire 4. Further, by use of the printing technique, the stress relaxation layer 5 can be patterned as a thick-film electrically insulating layer without use of any exposure and developing technique. The stress relaxation layer 5 can have an inclined surface for forming the redistributing wire 4.

According to this embodiment, the reliability of bonding of the semiconductor device 13 is improved greatly even in the case where the semiconductor device 13 is subjected to flip chip bonding without any underfill.

Hence, according to this embodiment, flip chip bonding without any underfill can be applied to most of electrical appliances. It is found that the cost for producing each electrical appliance can be reduced.

Moreover, because no underfill is used, the semiconductor device 13 can be removed. That is, when the semiconductor device 13 connected to the circuit substrate is defective, the semiconductor device 13 can be removed from the circuit substrate so that the circuit substrate can be recycled. Hence, the cost for producing each electrical appliance can be also reduced.

The material of the stress relaxation layer 5 according to this embodiment will be described below. The best material for use in formation of the stress relaxation layer 5 in this embodiment is polyimide paste. Besides the polyimide paste, a modified amide-imide resin, an ester-imide resin, an ether-imide resin, a polyester resin, a modified silicone resin, a modified acrylic resin, etc. may be used.

Among the listed resins, resins having imide bonds, such as polyimide, amide-imide, ester-imide, ether-imide, etc., are excellent in heat mechanical characteristic such as strength at a high temperature because the resins have strong skeletons formed by imide bonds. As a result, the method of forming a plating power supply film for wiring can be selected from various methods. For example, a method of forming a plating power supply film by a high-temperature process such as sputtering can be selected. Resins, such as a silicone resin, an acrylic resin, a polyester resin, an amide-imide resin, an ester-imide resin and an ether-imide resin, having portions condensed by bonds other than imide bonds are slightly inferior in heat mechanical characteristic but may be advantageous in terms of processability, resin cost, etc. For example, a polyester-imide resin is easy to handle because the curing temperature of polyester-imide is generally lower than that of polyimide. In this embodiment, these resins are used suitably and selectively in overall consideration of device characteristic, cost, heat mechanical characteristic, etc.

As the material for forming the stress relaxation layer 5, one member selected from the group, for example, consisting of an epoxy resin, a phenol resin, a polyimide resin, a silicone resin, etc., may be used singly or two or more members selected from the aforementioned group may be used in combination. In addition, a coupling agent for improving adhesion to various interfaces, a colorlant, etc. may be mixed with the material for forming the stress relaxation layer 5.

Although stress relaxation layer 5 having an elastic modulus in a range of from 0.1 to 10.0 GPa at room temperature is applicable, it is preferable that the stress relaxation layer 5 having an elastic modulus lower than that of available polyimide is used. If the elastic modulus is lower than 0.1 GPa, the wiring portion is apt to be deformed when a protrusive electrode which will be described later is formed or when the semiconductor device is subjected to a function test. Hence, there is a fear that a problem of wire breakage etc. occurs. If the elastic modulus of the stress relaxation layer 5 becomes large to be higher than 10.0 GPa, a sufficient stress relaxing effect cannot be obtained. Hence, there is fear that the reliability of bonding is lowered when the semiconductor device is mounted on the substrate.

Further, preferably, a material curable at a temperature of from 100° C. to 250° C. is used as the material for the stress relaxation layer 5. If the curing temperature is lower than 100° C., control can be hardly made in the steps of the semiconductor producing process. If the curing temperature is higher than 250° C., there is a fear that wafer stress may be increased by thermal shrinkage caused by curing and cooling, or the characteristic of the semiconductor device may be changed.

Figure 41:
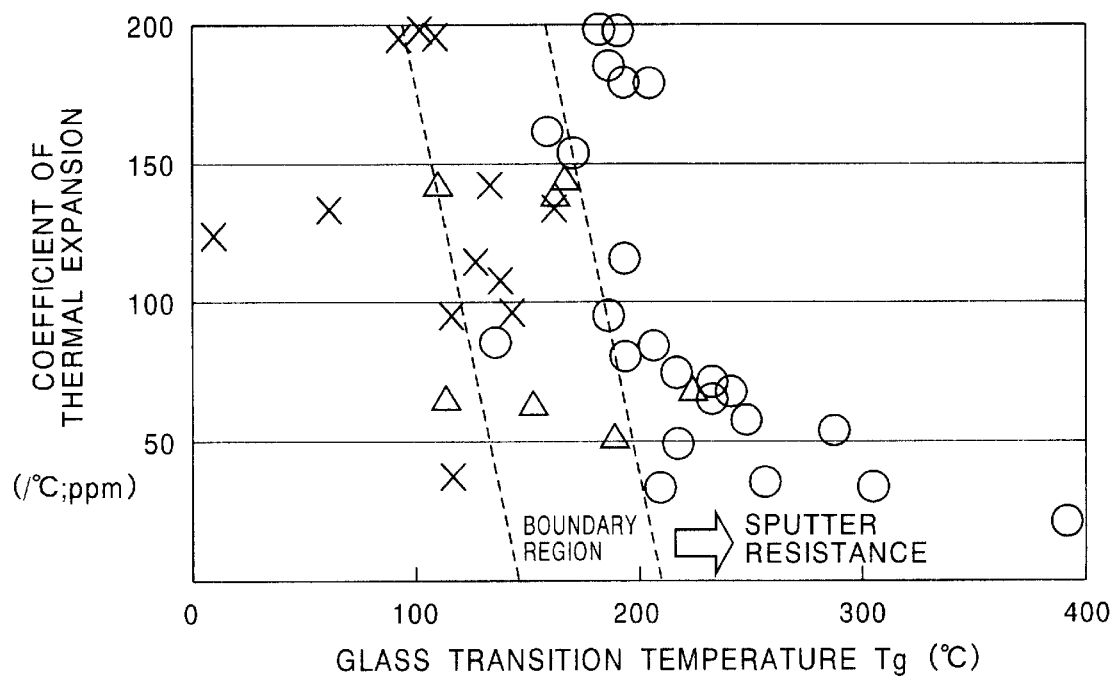
FIG. 41 is a graph showing a relationship between glass transition temperature and coefficient of thermal expansion.

After cured, the stress relaxation layer is subjected to various steps such as sputtering, plating, etching, etc. Hence, the stress relaxation layer needs to have characteristic such as heat resistance, chemical resistance, solvent resistance, etc. Specifically, it is preferable that the glass transition temperature (Tg) of the stress relaxation layer exhibiting heat resistance is selected to be in a range of from 150° C. to 400° C., more preferably not lower than 180° C., further preferably not lower than 200° C. FIG. 41 shows an experimental result showing the relationship between the glass transition temperature (Tg) and the coefficient of thermal expansion. As apparent from FIG. 41, no cracking occurs when the glass transition temperature (Tg) is not lower than 200° C. Incidentally, from the viewpoint of suppressing the quantity of deformation in various temperature treatments in the steps, it is preferable that the thermal expansion coefficient ($\alpha 1$) is selected to be as small as possible in a temperature region of not higher than Tg. Specifically, the thermal expansion coefficient is preferably selected to be as near as 3 ppm. Generally, in most cases, a material of low elasticity has a large coefficient of thermal expansion. In this embodiment, it is preferable that the thermal expansion coefficient for the material of the stress relaxation layer 5 is selected to be in a range of from 3 ppm to 300 ppm, more preferably in a range from 3 ppm to 200 ppm, further preferably in a range of from 3 ppm to 150 ppm.

On the other hand, the thermal degradation temperature (Td) is preferably selected to be not lower than about 300° C. If Tg and Td are lower than 200° C. and 300° C. respectively, there is a risk that deformation, denaturation and degradation of resin may occur in thermal steps such as sputtering and sputter etching in the process. From the viewpoint of chemical resistance, it is preferable that resin degradation such as discoloration, deformation, etc. does not occur even after the resin is immersed in a solution of 30% sulfuric acid or in a solution of 10% sodium hydroxide for 24 hours or more. With respect to solvent resistance, solubility parameter (SP value) is preferably selected to be in a range of from 8 to 20 $(cal/cm^3)^{1/2}$. When the stress relaxation layer 5 is made of a material containing a base resin and several components modified, it is preferable that most of the components is in the above-mentioned SP range. More specifically, it is preferable that components having SP values smaller than 8 or larger than 20 are not contained with the total amount larger than 50% by weight.

If the chemical resistance or the solvent resistance of the resins is insufficient, the production process applicable to the embodiment may be limited and this limit may be undesirable from the viewpoint of reduction in production cost. Practically, it is preferable that the material for the stress relaxation layer 5 is determined in overall consideration of the cost of the material satisfying the above-mentioned characteristics and the degree of freedom in the process.

Figure 18:
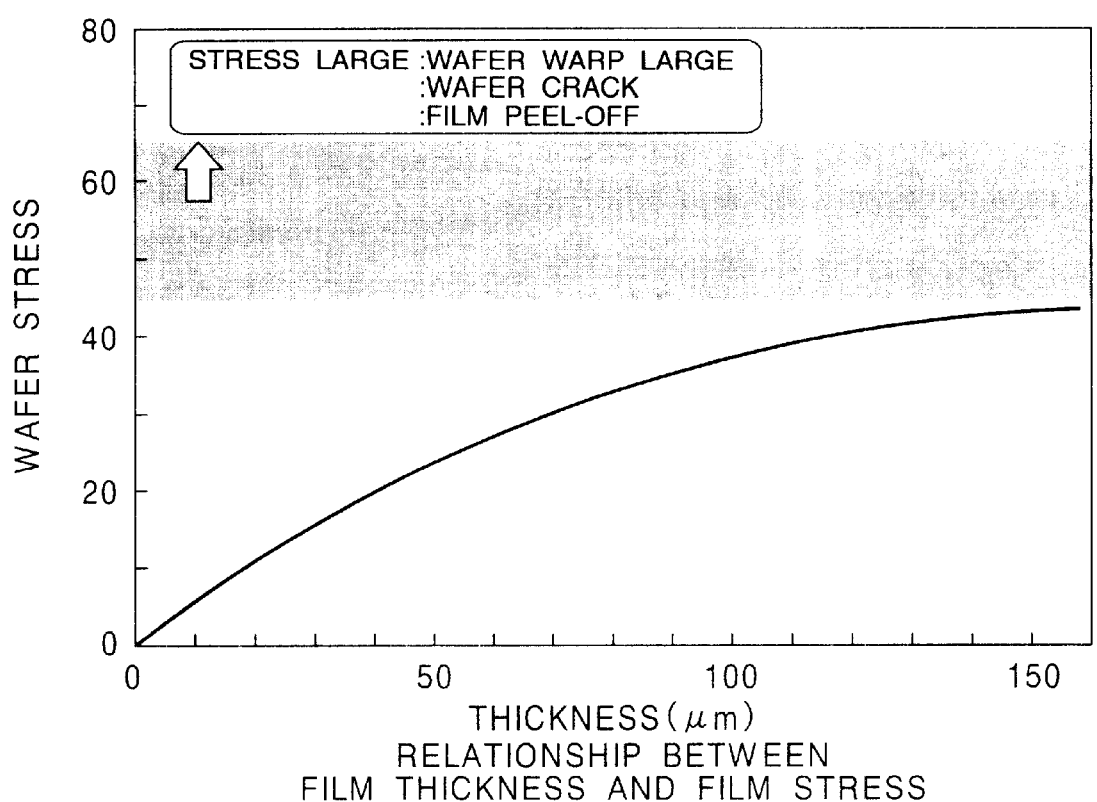
FIG. 18 is a graph showing a relationship between the thickness of the stress relaxation layer and the stress on the wafer.

The relationship among the thickness of the stress relaxation layer, the wafer stress and the α-rays will be described below. FIG. 18 shows the relationship between the thickness of the stress relaxation layer and wafer stress. As shown in FIG. 18, in the case where the stress relaxation layer is applied onto a wafer with a diameter of 8 inches and then cured, wafer stress increases if the stress relaxation layer is thicker than 150 micrometers. As a result, a warp of the wafer is made large, or cracking of the wafer, peeling-off of the electrically insulating film, etc. are apt to occur.

Figure 19:
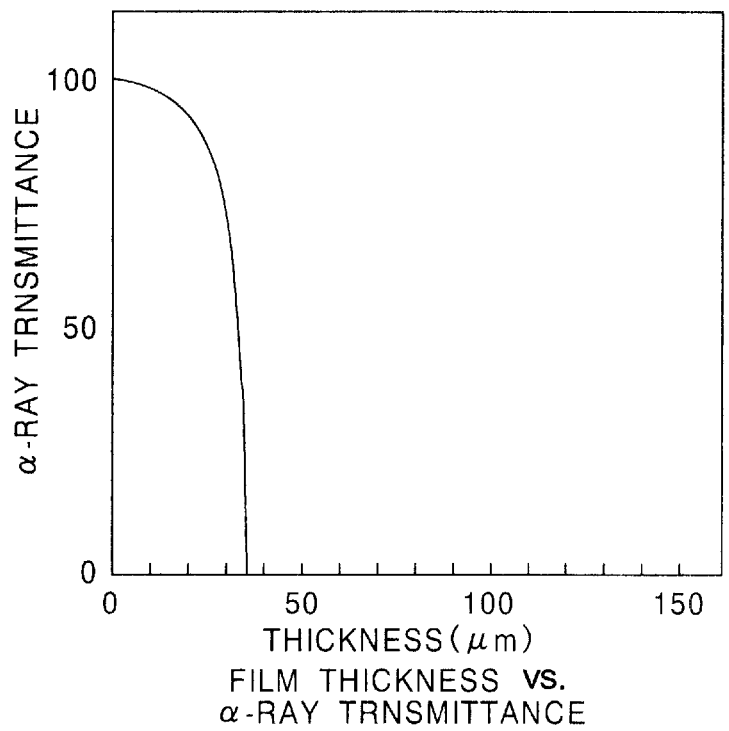
FIG. 19 is a graph showing a relationship between the thickness of the stress relaxation layer and the α-ray transmittance.

On the other hand, FIG. 19 shows the relationship between the thickness of the stress relaxation layer and the dose of α-rays transmitted through the stress relaxation layer. α-rays are generated due to decay of uranium, thorium, etc. contained as impurities in solder for use in the semiconductor device. α-rays cause soft-error of the transistor portion. As shown in FIG. 19, α-rays hardly pass through the stress relaxation layer if the thickness of the stress relaxation layer is larger than 35 micrometers. In this case, there is no problem of soft-error caused by α-rays. On the contrary, if the thickness of the stress relaxation layer is smaller than 35 micrometers, it is apparent that malfunction is apt to be caused by α-rays, because α-rays pass through the stress relaxation layer.

From the above-mentioned relationships, when the thickness of the stress relaxation layer is selected to be in a range of from 35 micrometers to 150 micrometers, α-rays can be prevented from reaching the circuit portion formed on the surface of the semiconductor device, and the reliability of bonding the semiconductor device to the substrate having the semiconductor device mounted thereon can be kept high.

Figure 20:
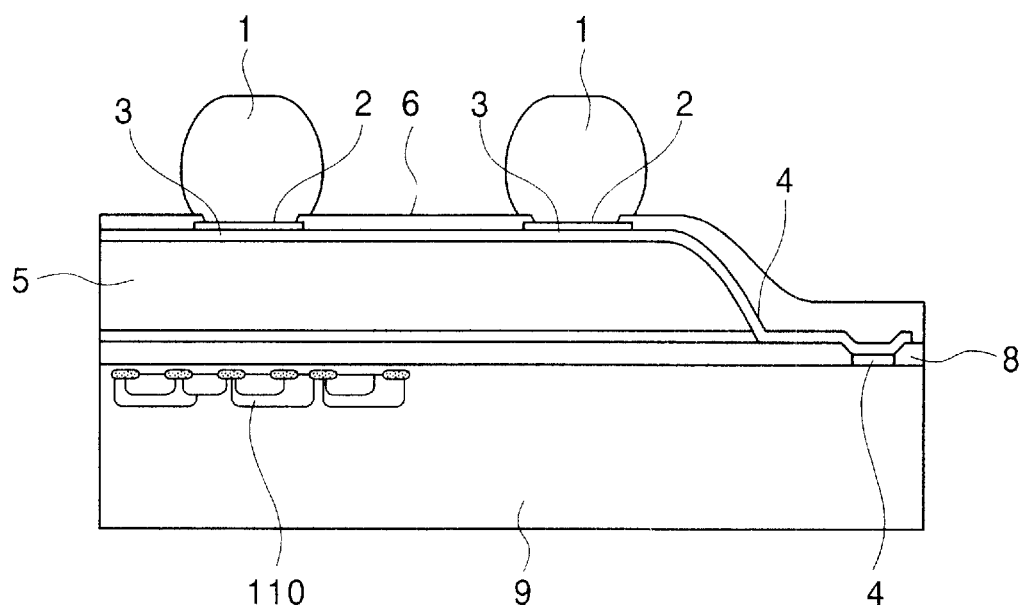
FIG. 20 is a view showing an embodiment of the structure of the semiconductor device according to the present invention.
Figure 21:
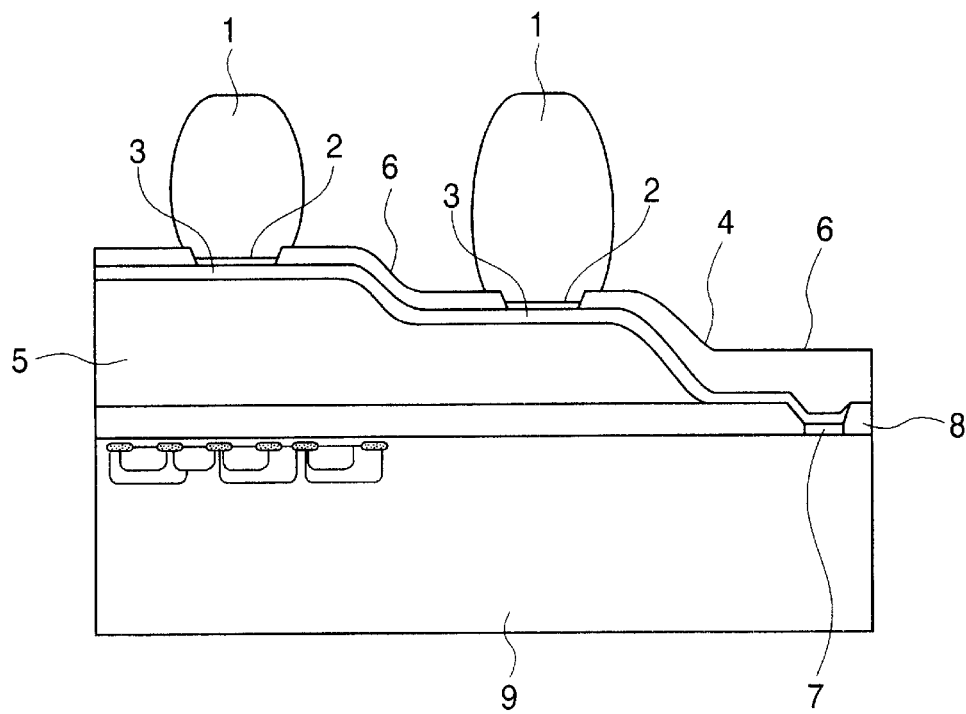
FIG. 21 is a view showing an embodiment of the structure of the semiconductor device according to the present invention.

Incidentally, in accordance with the layout of the semiconductor device, some portion in one device is affected easily by α-rays and some other portion in the same device is hardly affected by α-rays. An example of the former portion is a memory cell 110 having transistors easily inducing soft-error due to α-rays. Therefore, as shown in FIGS. 20 and 21, the thickness of the stress relaxation layer at the portion which is particularly apt to be affected by α-rays is selected to be in a range of from 35 micrometers to 150 micrometers. In such a manner, α-rays can be prevented from reaching the circuit portion formed on the surface of the semiconductor device.

Figure 38:
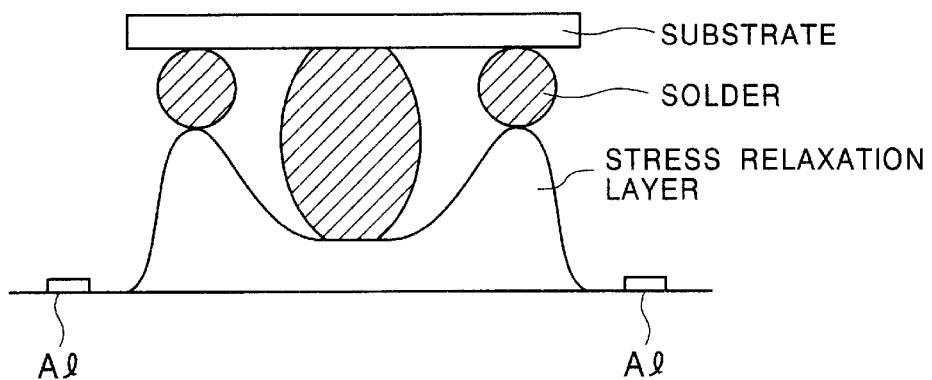
FIG. 38 is a view showing a further embodiment of the structure of the semiconductor device according to the present invention.
Figure 39A:
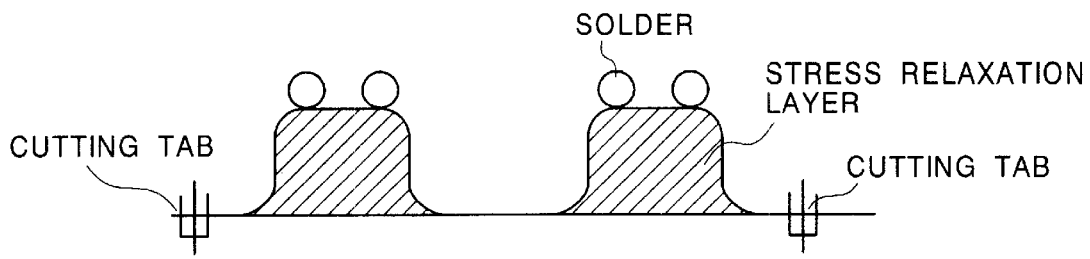
FIGS. 39a, 39b and 39c are views showing a further embodiment of the structure of the semiconductor device according to the present invention.
Figure 39B:
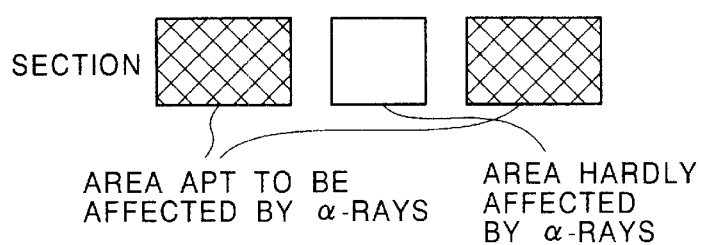
Figure 39C:
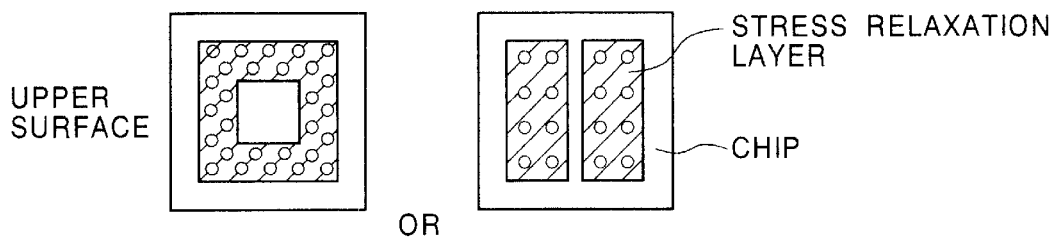

Incidentally, in the case where the thickness of the stress relaxation layer formed on an area hardly affected by α-rays is selected to be smaller than 35 micrometers, there is no problem from the viewpoint of α-ray shielding. Hence, for example, as shown in FIG. 21, the stress relaxation layer in the area required to be shielded from α-rays may be made thick whereas the stress relaxation layer in the other area may be made thin. In such a manner, the average thickness of the stress relaxation layer as a whole can be selected to be in a range of from 35 micrometers to 150 micrometers. When such measures are taken, it is preferable that the semiconductor device is configured in consideration of the magnitude of strain applied onto each bump due to induced thermal stress. Generally, as a portion approaches the outer circumference of the semiconductor device 13, the portion is apt to suffer strain with induced thermal stress. Hence, the stress relaxation layer is required to be made thicker at the portion. Hence, it is preferable that the transistor area apt to be affected easily by α-rays is disposed in the outer circumference of the semiconductor device 13 whereas the area hardly affected by α-rays is disposed in the center and its vicinity of the semiconductor device 13. For example, as shown in FIG. 38, the stress relaxation layer 5 may be formed as follows. That is, the stress relaxation layer 5 is thin in the center and its vicinity of the semiconductor device 13 whereas the stress relaxation layer 5 is thicker at the portion of the stress relaxation layer 5 located nearer the outer circumferential portion of the semiconductor device 13. In this case, each of the bumps in the center and its vicinity of the semiconductor device 13 has a high connection height and a low connection angle in comparison with each bump in the other area of the semiconductor device 13. Hence, the stress relaxing function of the bumps in the center of the semiconductor device can be increased to be substituted for the stress relaxing function of the stress relaxation layer thinned in the other area of the semiconductor device. Incidentally, in the case of a semiconductor device 13 having an area never affected by α-rays, the stress relaxation layer 5 need not be formed in the center and its vicinity of the semiconductor device 13 if the area never affected by α-rays is disposed in the center and its vicinity of the semiconductor device 13 as shown in FIG. 39.

Another embodiment of the stress relaxation layer containing fine particles which are different in composition from the above stress relaxation layer will be described below.

The fine particles contained in the aforementioned stress relaxation layer 5 are made of the same material as that of the stress relaxation layer 5 and have the same physical property as that of the stress relaxation layer 5. The fine particles dispersed in the stress relaxation layer can exhibit viscoelasticity necessary for printing.

In this structure, however, there is a possibility that wire may be broken due to concentration of thermal stress etc. into the boundary between the wafer and the stress relaxation layer 5 because the physical property value changes extremely in the boundary.

In this embodiment, therefore, the characteristic of the stress relaxation layer 5 formed on the circuit-forming surface of the wafer is made to vary in a direction of the thickness of the stress relaxation layer 5 so that the characteristic of the stress relaxation layer on the wafer surface side comes near the characteristic of the wafer.

Hence, the characteristic difference in the boundary between the upper surface of the wafer and the lower surface of the stress relaxation layer is reduced so that discontinuing force is not applied onto the wire provided on the wafer and stress relaxation layer and so that tension, compression and bending stress induced due to the expansion and contraction of the stress relaxation layer is not applied onto the wire portion. Hence, the wire portion can be prevented from being broken.

Moreover, in an arrangement, the characteristic of the stress relaxation layer 5 on the wafer side is set to be near that of the wafer whereas the characteristic of the stress relaxation layer 5 on the substrate side on which the semiconductor device is mounted is set to be near that of the substrate. This arrangement is effective for improvement of the bonding lifetime of the connection portion between the semiconductor device and the substrate as well as improvement of the lifetime of the wire formed on the stress relaxation layer 5.

Figure 22:
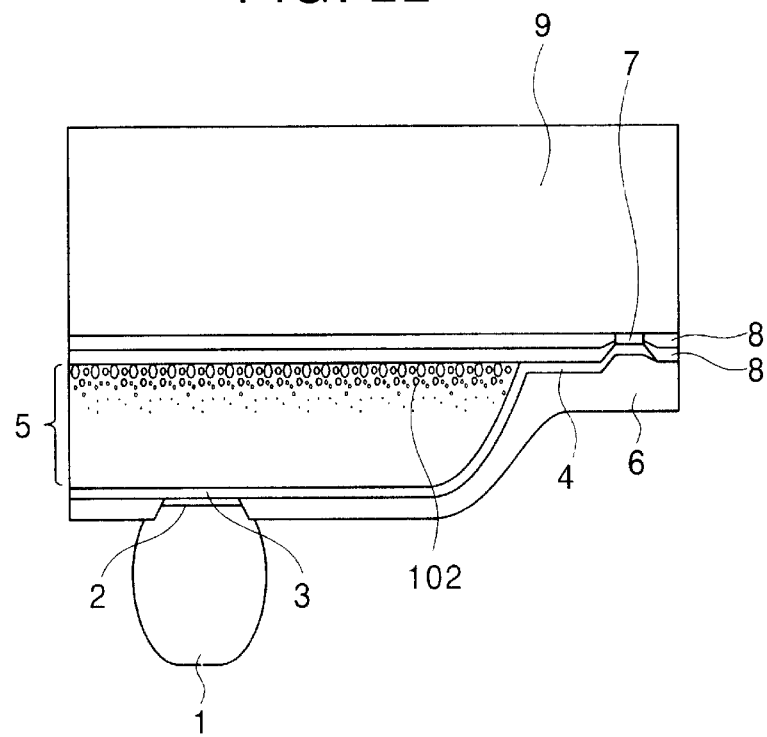
FIG. 22 is a view showing an embodiment of the structure of the semiconductor device according to the present invention.

On this occasion, a coefficient of thermal expansion or an elastic modulus is considered as the characteristic variable in the direction of the thickness of the stress relaxation layer 5. A specific means for changing the characteristic of the stress relaxation layer is as shown in FIG. 22. That is, silica particles 102 are mixed with the stress relaxation layer 5 as electrically insulating particles. The mixture proportion of the silica particles 102 in the stress relaxation layer 5 is distributed in a direction of the thickness of the stress relaxation layer 5 so that the thermal expansion coefficient or the elastic modulus is changed gradually. In a portion in which a large amount of silica particles 102 are distributed, the thermal expansion coefficient of the stress relaxation layer 5 is low and the elastic modulus thereof is high. On the other hand, as the mixture proportion of the silica particles 102 decreases, the thermal expansion coefficient of the stress relaxation layer 5 increases and the elastic modulus thereof decreases.

In the process of producing the semiconductor device in this embodiment, the formation of the circuit on the wafer, the formation of the stress relaxation layer, the distribution of the silica particles in the stress relaxation layer, the formation of the wire on the stress relaxation layer, etc. can be performed in a wafer state. Hence, the steps can be simplified as a whole, fluctuation etc. in production is reduced, and the lifetime of the wire portion can be improved.

In this embodiment, at least one kind of particles selected from inorganic materials such as silica, alumina, boron nitride, etc., which are electrically insulating particles for adjusting elasticity and thermal expansion, may be mixed with the stress relaxation layer 5. In addition, particles of an organic material such as polyimide, silicone, etc. may be mixed with the stress relaxation layer 5 properly as occasion demands.

Further, a coupling agent such as alkoxysilane, titanate, etc., for improving adhesion to the silica particles or to various interfaces constituting the electrically insulating resin layers; a modifying agent such as a thermoplastic resin for improving breaking extension and breaking strength of the resin; a dye or pigment for coloring the electrically insulating resin layer which is formed to prevent the circuit portion formed on the wafer from inducing soft-error due to ultraviolet rays, or the like; a cure accelerator for accelerating the curing reaction of the resin layer, and so on, may be mixed with the stress relaxation layer 5.

An example for the method of forming the stress relaxation layer 5 having characteristic variable in the direction of the thickness thereof is described as follows. That is, a liquid-state stress relaxation layer 5 containing the aforementioned materials is applied onto the circuit surface of the wafer. In a process for heating and curing the applied liquid-state stress relaxation layer 5, electrically insulating particles of silica, or the like, mixed with the stress relaxation layer 5 are sedimentary gradually on the wafer side. When the particle size of the silica particles is distributed, particles larger in particle size are precipitated rapidly and particles smaller in particle size are less precipitated. When the stress relaxation layer is heated and cured under the condition that the wafer is turned over, a distribution of characteristic is formed in the direction of the thickness of the stress relaxation layer.

As a method for controlling the concentration distribution of silica particles mixed with the stress relation layer 5 in the direction of the thickness thereof, there are: a method of changing the mixture proportion and kind of the cure accelerator for properly adjusting the curing temperature of the electrically insulating resin and the curing temperature profile thereof or for accelerating the curing speed of the electrically insulating resin; a method of mixing suitably a reaction decelerator, or the like, for decelerating the curing of the electrically insulating resin; and a method of changing the particle size distribution of electrically insulating particles such as silica particles.

Examples of silica particles that are applicable to this embodiment include: silica fragments obtained by crushing an ingot formed by melting silica particles; silica spheres obtained by hot-melting silica particles after a silica ingot is crushed into silica particles; synthetic silica particles; and so on. The particle size distribution and mixture proportion of silica particles can be changed variously in accordance with the size, thickness and integration degree of the semiconductor device formed into the structure according to this embodiment; the thickness of the stress relaxation layer 5; the size of particles and the kind of the substrate for mounting the semiconductor device thereon.

When the stress relaxation layer 5 is formed by a printing method, it may be necessary to change the particle size distribution in accordance with the printing method and in accordance with the size of the mask to be used.

Figure 23:
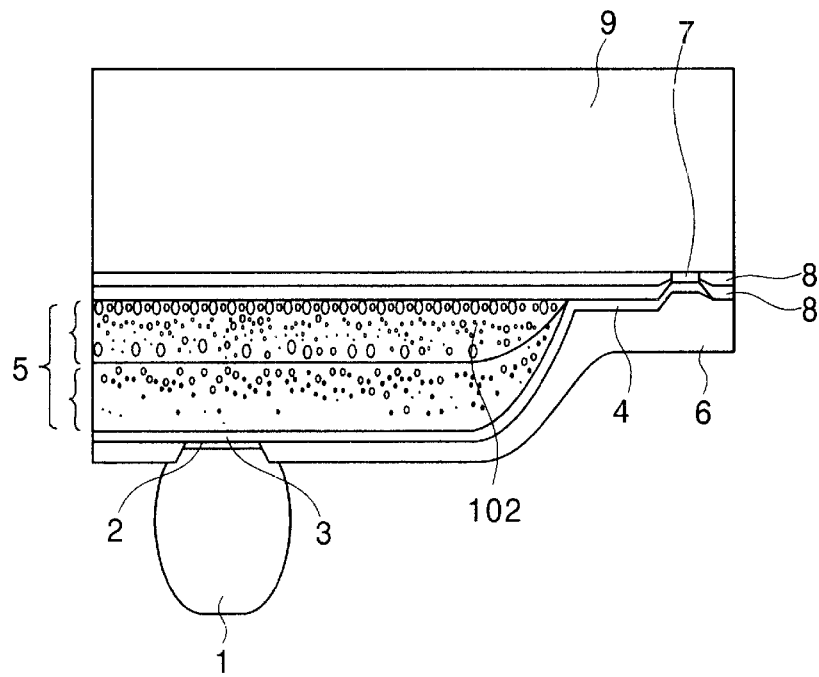
FIG. 23 is a view showing an embodiment of the structure of the semiconductor device according to the present invention.

Incidentally, the stress relaxation layer 5 need not be formed with a single printing operation step. As shown in FIG. 23, the stress relaxation layer 5 may be formed by printing with at least two printing operation steps. Further, printing may be made under the condition that the mixture proportions of silica particles contained in respective layers of the stress relaxation layer are made different from each other.

In this embodiment, the physical property of the portion in which the wire is formed does not change extremely on the boundary between the circuit portion on the wafer and the electrode provided on the stress relaxation layer. Hence, a large stress is not concentrated into a part of the wire, and the wire can be therefore prevented from being broken.

An embodiment of the semiconductor device 13 will be described below with reference to FIG. 24. In this embodiment, the stress relaxation layer 5 is made thin in a portion just under a bump 1 disposed near the periphery of the semiconductor device 13 in comparison with the stress relaxation layer 5 in the other portion of the semiconductor device 13. Further, the height of a bump 1a disposed on the outermost circumference of the semiconductor device 13 is lower by δ than that of a bump 1b adjacent to the bump 1a on the inner side.

As a method for reducing the thickness of the stress relaxation layer 5 in the peripheral portion of the semiconductor device 13, there is a method of changing the presence/absence of fine particles contained in the stress relaxation layer-forming material such as a polyimide paste material; the shape and mixture proportion of the particles; printing conditions such as printing speed, releasing speed of the print mask or the number of times of printing; the proportion of the solvent in the paste, etc.

Generally, in comparison with the bump 1b or the like, the bump 1a located in a region near the periphery of the semiconductor device 13 suffers large strain due to various loads after the semiconductor device 13 is bonded onto the circuit substrate 14. For example, the thermal expansion coefficient of the semiconductor device 13 is different from that of the circuit substrate 14. Hence, as the bump 1a is disposed in the region nearer the periphery of the semiconductor device 13, larger strain occurs in the bump 1a at the time of temperature rising. When the strain is large or when the strain acts repeatedly, the bump 1a located in the region near the periphery of the semiconductor device 13 is apt to be destroyed.

Figure 25:
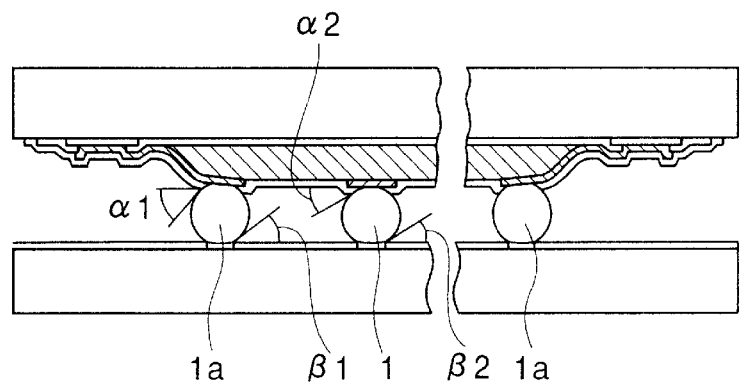
FIG. 25 is a view showing a state in which the semiconductor device having the stress relaxation layer partially thinned is bonded onto a circuit substrate.

When the stress relaxation layer 5 in a region near the periphery of the semiconductor device 13 is thinned as described in this embodiment, the shape of a bump 1 disposed on a position corresponding to the region is made controllable. When connected to the circuit substrate 14, the bump 1a is formed to have a longer length than that of the bump 1 other than the bump 1a, as shown in FIG. 25. Because the bump 1a having the longer length has the same volume as that of the bump 1 other than the bump 1a, the contact angle between the bump 1a and the bump pad 3 and the contact angle between the bump 1a and the pad on the circuit substrate 14 are made larger than the contact angle between the bump 1 and the bump pad 3 and the contact angle between the bump 1 and the pad on the circuit substrate 14. That is, in FIG. 25, the relations α1>α2 and β1>β2 are obtained.

When the contact angle is made large, concentration of stress into the connection portion between the bump and the pad is relaxed. The stress relaxation layer 5 in a place where the bump pad 3 is formed in the periphery of the semiconductor device 13 is set to be thinner than the stress relaxation layer 5 in the place other than the periphery of the semiconductor device so that the bump 1 is formed into a shape having a length longer. In such a manner, the reliability of bonding the semiconductor device 13 to the circuit substrate 14 can be improved. Incidentally, the sectional shape of the stress relaxation layer 5 can be designed in a range in which the height of the bump 1 does not disturb the connection of the semiconductor device 13 onto the circuit substrate 14. Various sectional shapes can be conceived.

The size of δ is determined in consideration of (1) the stress relaxing characteristic required for the bump 1a having the longer length and located on the outermost circumference, (2) the allowance of variation in bump height at the time of inspection of the function of the semiconductor device 13, (3) the allowance of variation in bump height at the time of connection of the semiconductor device 13 to the circuit substrate 14, and so on. More specifically, the stress relaxing characteristic is obtained on the basis of the elastic modulus of the stress relaxation layer 5 and the size of the semiconductor device 13. On the other hand, the allowance of variation at the time of inspection of the function of the semiconductor device 13 and the allowance of variation at the time of connection of the semiconductor device to the circuit substrate 14 are obtained also in consideration of the deformation of the solder ball and the deformation of the stress relaxation layer 5. When, for example, an inspection jig is pressed against the stress relaxation layer 5 from the upper surface of the bump to thereby deform the stress relaxation layer 5, the function of the semiconductor device 13 can be inspected under the condition that there is substantially no variation in bump height. In the case where the aforementioned operation is made, because the elastic modulus of the stress relaxation layer 5 is considerably lower than that of the solder bump material, preference of the deformation of the stress relaxation layer 5 is given to the deformation of the solder bump to prevent the solder bump from being injured. Hence, even in the case where the value of δ required on the basis of the stress relaxing characteristic is larger than the variation in bump height required of a function inspection apparatus, there is no disturbance if δ is within a range corresponding to the deformation of the stress relaxation layer 5. Further, because the stress relaxing material is elastic, the shape is restored after the completion of the inspection. Accordingly, there is no special problem also at the time of connection to the substrate. In consideration of this fact, the value of δ is actually determined on the basis of the aforementioned points (1) and (3). Because a good result of the stress relaxing characteristic is obtained, as described above, if the thickness of the stress relaxation layer 5 is in a range of from 35 to 150 micrometers, the value of δ is obtained as δ=150−35=115 micrometers on the basis of the stress relaxing characteristic. The value of δ=115 micrometers is approximately equal to the upper limit allowed at the time of connection to the circuit substrate 14. Hence, in most of the cases, value of δ=115 micrometers is provided as the upper limit.

Further, the structure according to this embodiment can be applied also to the case were bumps must be formed in the inclined portion of the stress relaxation layer in consideration of the wire in the semiconductor device with an advance of miniaturization of the semiconductor device.

Figure 24:
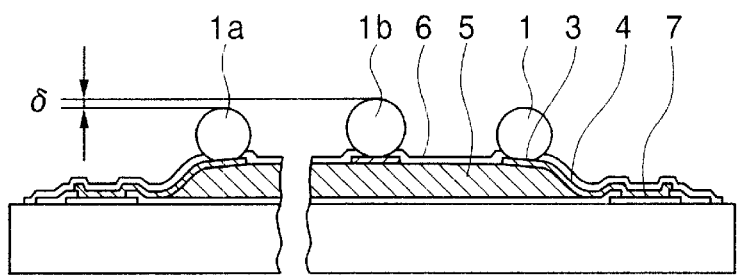
FIG. 24 is a view showing a semiconductor device having a stress relaxation layer partially thinned.
Figure 40:
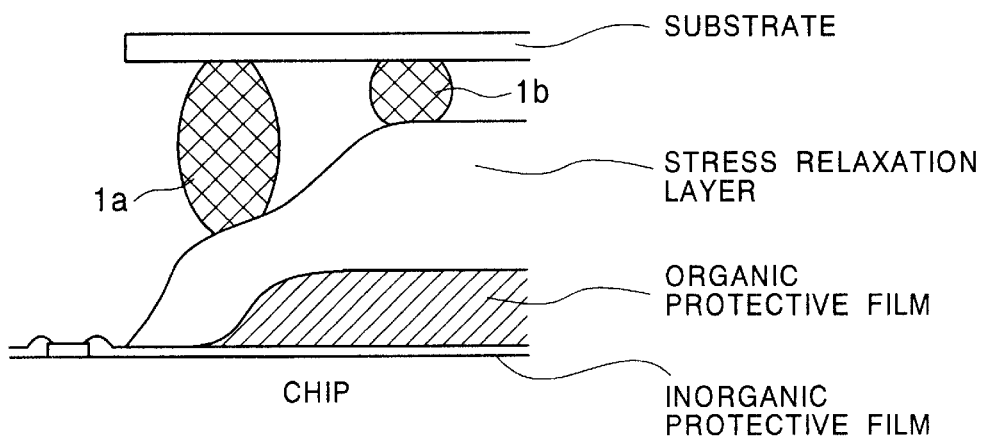
FIG. 40 is a view showing a further embodiment of the structure of the semiconductor device according to the present invention.

Whereas FIG. 24 has shown the case where the thickness of the stress relaxation layer 5 is controlled to give a height difference between the bump 1a on the outermost circumference of the semiconductor device 13 and the bump 1b adjacent to the bump 1a on the inner side, a method of adjustment of the structure of the protective layer 8 may be used as another method to give a height difference between the bumps 1a and 1b. For example, as shown in FIG. 40, there is a method in which the organic layer of the protective film 8 is not formed or made thin in a portion just under the bump 1a on the outermost circumference whereas the organic layer of the protective film 8 is made thick in the side inner than the bump 1b. When a desired height difference δ is achieved by suitably adjusting and controlling the thickness of the stress relaxation layer 5 and the thickness of the organic layer of the protective film 8 as occasion demands, no problem occurs.

The bumps located on the outermost circumference of the semiconductor device are apt to suffer external force, so that solder may crack, etc. Therefore, some of the bumps located on the outermost circumference may be used as buffer members. In this case, it is preferable that the bumps used as the buffer members are made unnecessary for the electrical operation of the semiconductor device so as not to be electrically connected to the aluminum pads 7 respectively. As a result, the time till the bumps necessary for the electrical operation of the semiconductor device are broken can be elongated. Incidentally, some bumps used as buffer members may be enlarged in diameter so that the time till the bumps other than the buffer bumps are broken can be elongated more greatly. Incidentally, any known method for enlarging the bump diameter may be used in this embodiment. To illustrate a particularly preferable example of the method, bump lands (pads) are enlarged while the volume of solder in the bump lands is set to be equal to that in the other bumps. When the pad is enlarged, the connection diameter of the pad is enlarged. However, the bump height is lowered because the solder volume in the pad is equal to that in the other bumps. As a result, when the bump is connected to the circuit substrate 14, the contact angle between the bump and the pad is enlarged so that concentration of stress into the contact point between the bump and the pad can be avoided. Because the concentration of stress is eliminated, cracking in solder makes slow propagation. Moreover, because the bump diameter is increased, the absolute value of the cracking length to reach disconnection is increased to thereby largely contribute to elongation of the time till the bump is broken.

Figure 26A:
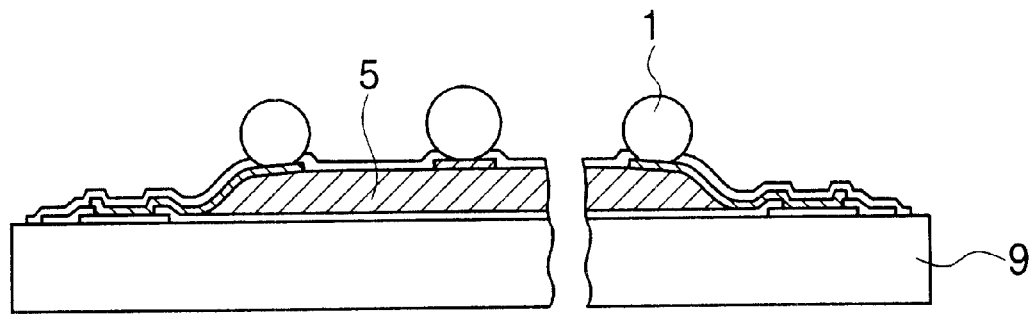
FIGS. 26a and 26b are views showing an embodiment of the structure of the semiconductor device according to the present invention.
Figure 26B:
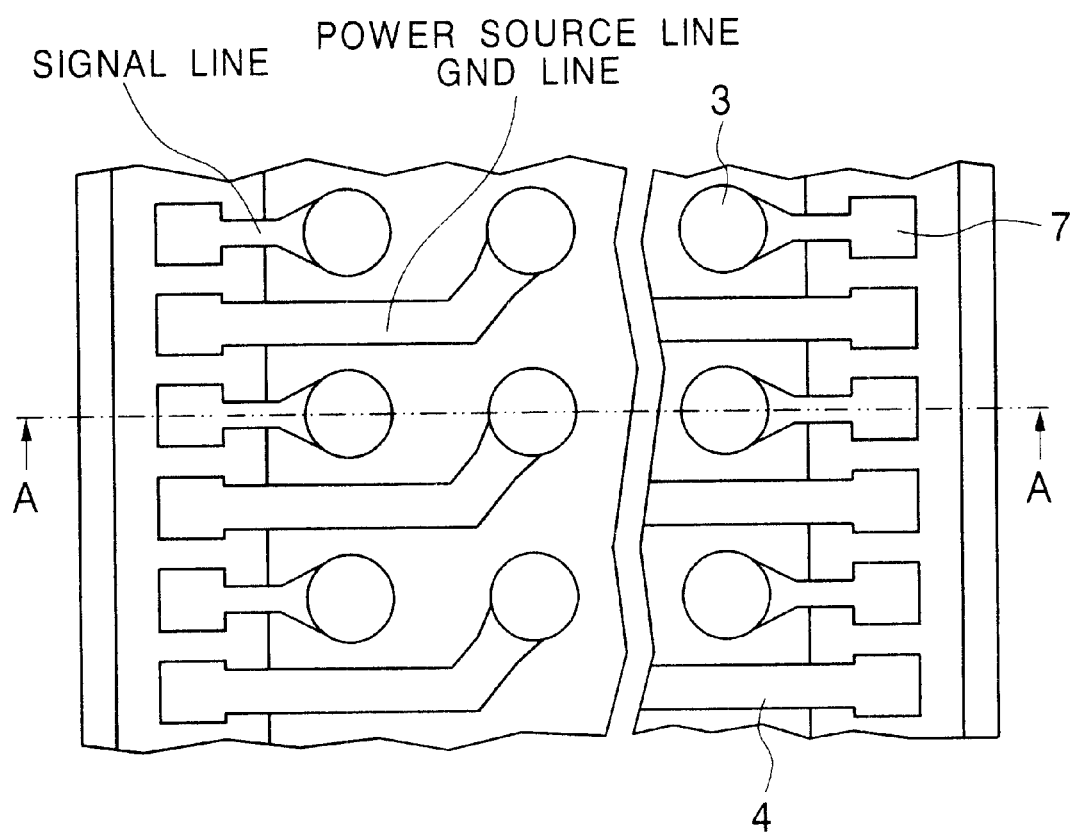

From the viewpoint of facilitating the design for drawing wire on the circuit substrate to connect the semiconductor device with the circuit substrate, it is preferable that the power/ground line is disposed in the center and its vicinity of the semiconductor device. As a result, as shown in FIGS. 26a and 26b, it is preferable that the redistributing wire 4 for connecting the aluminum pad 7 to the bump pad 3 near the aluminum pad 7 is used as the signal line whereas the redistributing wire 4 for connecting the aluminum pad 7 to the bump pad 3 far from the aluminum pad 7 is used as the power/ground line. In this case, the bump near the aluminum pad may be located in the inclined portion of the stress relaxation layer 5. Further, the width of the power/ground line may be set to be larger than the width of the signal line.

Figure 27:
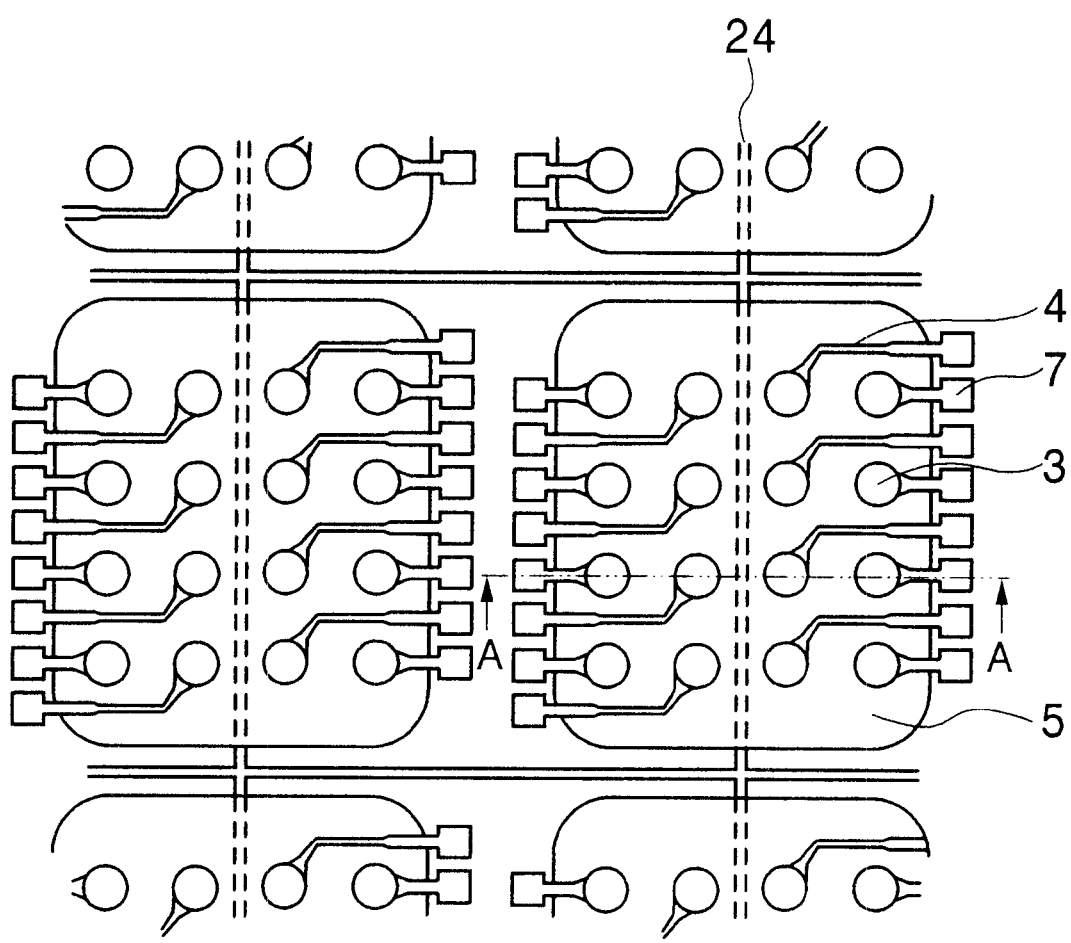
FIG. 27 is a view showing a state in which a stress relaxation layer is formed to extend across the boundary between adjacent semiconductor devices.

FIG. 27 shows a further embodiment of the semiconductor device. In this embodiment, the stress relaxation layer 5 is formed to extend over adjacent semiconductor devices 13 on the wafer 9 having semiconductor devices formed thereon. The aluminum pad 7, the bump pad 3 and the redistributing wire 4 for connecting these pads 3 and 7 are designed so that the redistributing wire 4 does not run across the boundary between the semiconductor device 13 and the adjacent semiconductor device 13. The production process is typically equivalent to the previously described steps except the seventh step and the steps after the seventh step.

Figure 28:
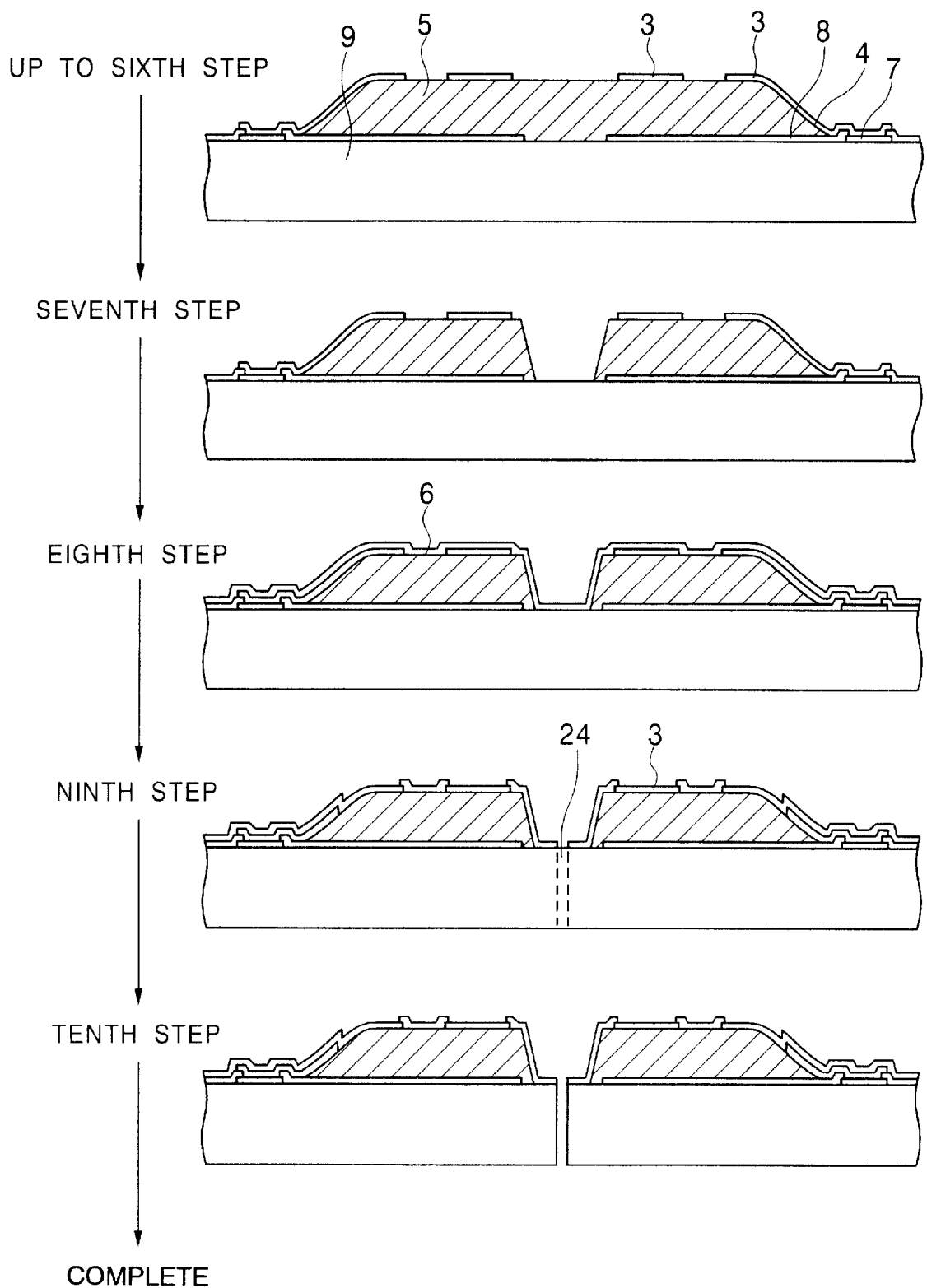
FIG. 28 is a view showing a method of cutting the stress relaxation layer.

When the semiconductor wafer is diced, it is necessary to cut the stress relaxation layer 5. The stress relaxation layer 5 is, however, made of a material of low elasticity. Further, a large part of the wafer 9 is made of silicon. Further, semiconductors made of silicone and different in strength from the stress relaxation layer are formed on the wafer 9. Hence, it is difficult to cut the stress relaxation layer 5 and the wafer 9 collectively. Therefore, after the stress relaxation layer 5 is cut, the wafer 9 having semiconductors formed thereon is diced. The steps will be described below with reference to FIG. 28.

In the modified seventh step, only the stress relaxation layer 5 is cut. A rotary knife adapted for cutting of a low-elasticity resin material is preferably used to cut the stress relaxation layer 5. Besides the rotary knife, a $CO_2$ laser, a sandblast, or the like, may be used.

In the modified eighth step, a solder resist is applied onto the whole surface to form the surface protective film 6. Besides a spin coating method, a printing method using a mesh mask or a curtain coating method may be used as a method for applying the solder resist. To apply the solder resist, it is preferable that the wall surface of the dicing area of the stress relaxation layer 5 in the modified seventh step is not perpendicular to the wafer but V-shaped. This coating is performed after the modified seventh step is completed, that is, after the stress relaxation layer is cut. Hence, invasion of foreign matters such as water, which may cause peeling-off of the stress relaxation layer 5 from the surface of the wafer 9 having semiconductors formed thereon and ions which may cause spoilage of semiconductors, can be reduced. Hence, a device with good durability etc. can be provided.

In the modified ninth step, a pattern for the surface protective film 6 is formed by photoexposure and development. As a result, the bump pad 3, the dicing area 24 and peripheries of the bump pad 3 and dicing area 24 are exposed through the surface protective film 6. Further, electroless gold plating is performed with use of the surface protective film 6 as a mask to thereby form a gold film on the bump pad 3. Although this embodiment has shown the case where only gold plating is performed, there is no special problem in the case where palladium plating or platinum plating is performed before gold plating is performed or in the case where tin plating is performed after gold plating is performed.

In the modified tenth step, the wafer 9 having semiconductors formed thereon is divided into semiconductor devices 13 by means of dicing. Incidentally, dicing is generally performed by use of a rotary knife.

By the aforementioned steps including the step of dicing the stress relaxation layer 5, semiconductor devices 13 can be produced.

According to this embodiment, the stress relaxation layer 5 can be formed without any problem even if the external size of the semiconductor device 13 is small. Specifically, in the case where the stress relaxation layer 5 is formed to extend over two adjacent semiconductor devices, the technique of forming the stress relaxation layer 5 need not be changed even if the external size of the semiconductor device 13 is reduced to about a half. Further, even if the size of the semiconductor device is changed, the semiconductor device may be produced by use of the same print mask simply by adjusting the shape and external size of the semiconductor device and the width and shape of the dicing area 24 which acts as a dicing tab for separating the semiconductor devices 13 from each other. Because the redistributing wire 4 connects the aluminum pad 7 and the bump pad 3 at the inclined portion of the stress relaxation layer 5 in the same manner as that in the first embodiment, there is no stress concentration portion in the redistributing wire 4, and flip chip bonding without any underfill can be made.

Incidentally, the structure according to this embodiment can be applied particularly to a semiconductor device such as DRAM having pads laid out in the center portion of the semiconductor device.

Although this embodiment has shown the case where the stress relaxation layer 5 extending over two adjacent semiconductor devices 13 is diced, the present invention may be applied also to a structure in which a stress relaxation layer 5 extending over at least two semiconductor devices 13, for example, four semiconductor devices adjacent to one another is cut, so long as a slope portion is formed in the stress relation layer 5 to make the redistributing wire 4 connect the aluminum pad 7 and the bump pad 3. It is a matter of course that the present invention may be applied to a structure in which a stress relaxation layer 5 extending over two adjacent rows of semiconductor devices is cut. In this case, the production method is a method in which displacement in a direction of the rows is allowed, so that the method can be applied to finer processing.

In each of the embodiments, corner portions of the stress relaxation layer 5 may be rounded as shown in FIGS. 2 and 27. If the corner portions are not rounded, failure of inclusion of air bubbles in the stress relaxation layer 5 is sometimes observed when the stress relaxation layer 5 is printed by use of a polyimide paste material. Moreover, the stress relaxation layer 5 is apt to be peeled off from the corner portions. If air bubbles remain in the stress relaxation layer 5, there arises a disadvantage that the redistributing wire 4 is disconnected because the air bubbles are exploded at the time of heating the semiconductor device 13. Therefore, it is preferable that corners of the pattern opening portion 18 of the print metal mask for use in formation of the stress relaxation layer 5 are rounded.

Incidentally, in each of the embodiments, the stress relaxation layer 5 may be formed by a printing method with use of a print metal mask or a dispenser.

Besides the printing method, a stamping method, a spray method using air or inert gas, an ink jet method, a method of sticking a non-cured or half-cured resin sheet, or a combination of suitable methods selected from these methods may be used for forming the stress relaxation layer 5.

In the case where the printing method is used for forming the stress relaxation layer, the stress relaxation layer has the inclined portion formed at an end portion of the print portion when the electrically insulating material is printed and the print mask is removed or when the electrically insulating layer is fluidized at the end portion of the print portion in a heat-curing process. According to this method, the stress relaxation layers and the end portions having a specific inclination can be formed collectively in a wafer.

In the case where the stamping method is used for forming the stress relaxation layer, an electrically insulating material for performing stress relaxation layer is applied onto a stamping mold so that the shape of the stress relaxation layer is transferred onto the wafer. Hence, it is possible to select an electrically insulating material in which the shape of an end portion of the stress relaxation layer does not change when the electrically insulating material is cured. In this case, the shape of the end portion can be kept constant easily in comparison with the printing method.

In the spray method in which an electrically insulating material is sprayed by use of gas, or the like, the shape of the stress relaxation layer formed is high in the degree of freedom because neither print mask nor stamping mold is used. When the nozzle shape is selected suitably, the stress relaxation layer that can hardly be formed by use of the print mask or by use of the stamping mold can be formed. The thickness of the stress relaxation layer can be adjusted by adjustment of the quantity of spay. Hence, the range of adjustment of the thickness is widely compared with the printing method or the stamping method.

In the method in which a half-cured or non-cured resin sheet is stuck, a thick-film stress relaxation layer can be formed. Because an electrically insulating resin formed in a sheet shape in advance is used, the stress relaxation layer is excellent in surface flatness.

When one method suitably selected from these methods is used or when two or more methods suitably selected from these methods are used in combination, a desired thickness of the stress relaxation layer and a desired inclination of the end portion can be obtained.

Figure 29:
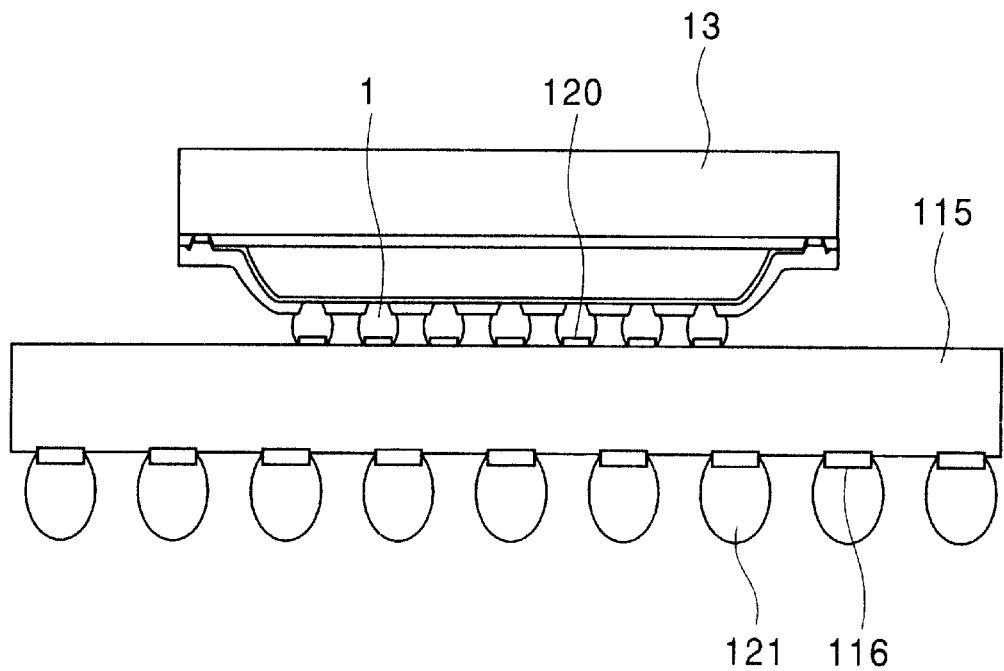
FIG. 29 is a view showing an embodiment of the semiconductor device mounted on a substrate.
Figure 30:
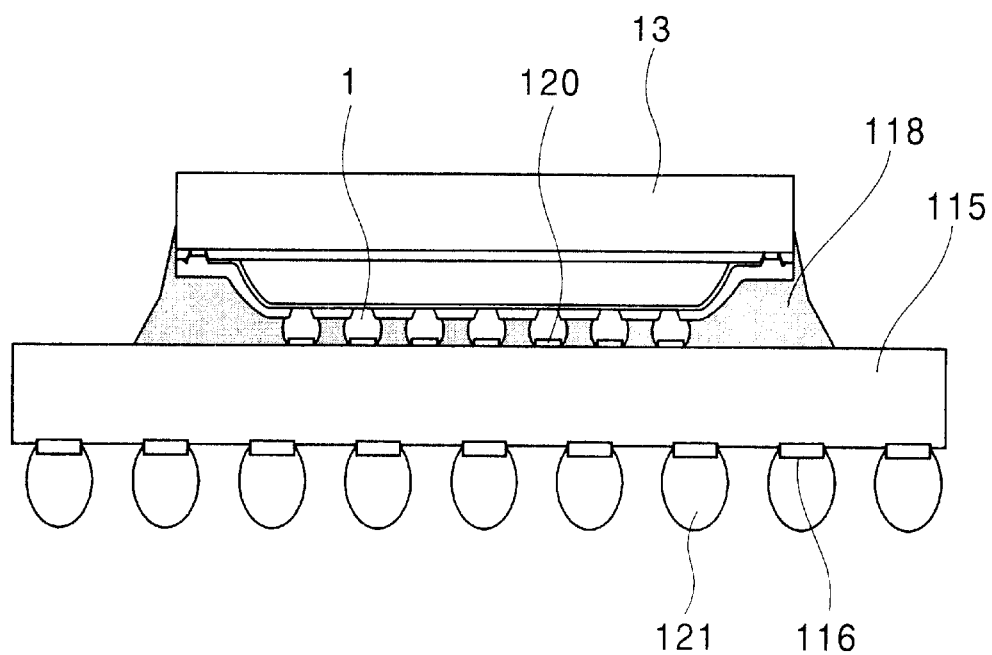
FIG. 30 is a view showing another embodiment of the semiconductor device mounted on a substrate.
Figure 31:
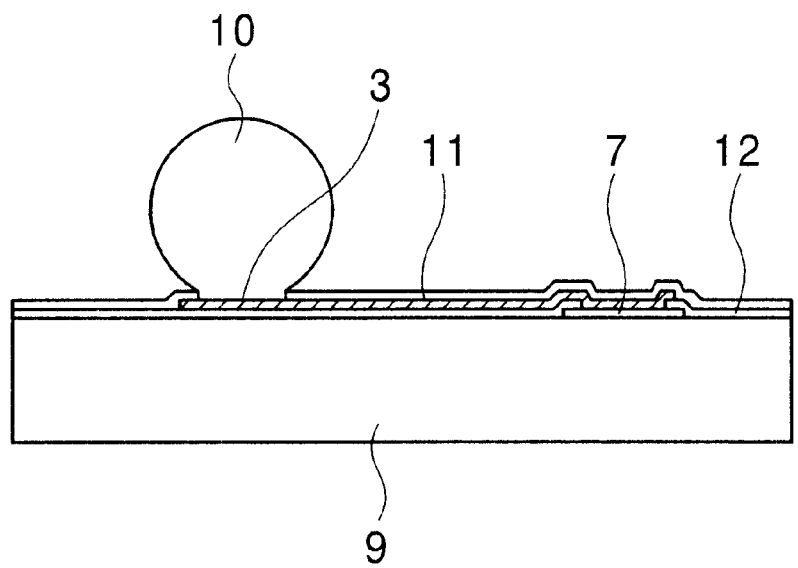
FIG. 31 is a view showing a conventional semiconductor device.
Figure 32:
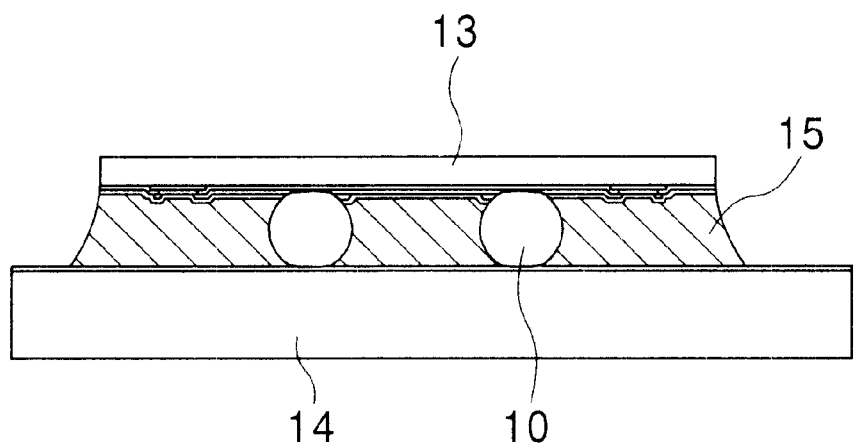
FIG. 32 is a view showing a state in which the conventional semiconductor device is bonded onto a circuit substrate.

A further embodiment of the semiconductor device will be described below. FIG. 29 is a schematic sectional view showing a state in which a semiconductor device is mounted on a substrate for converting the interval of protrusive electrodes on the semiconductor devices. FIG. 30 is a schematic sectional view showing a state in which the gap between the semiconductor device 13 and the substrate for mounting the semiconductor device 13 is sealed with a resin 118.

Protrusive electrodes 1 formed on the semiconductor device 13 are mounted on corresponding electrodes 120 of the substrate through a solder paste or flux. The protrusive electrodes 1 are melted in a reflow furnace, or the like, so that the substrate 115 and the semiconductor device 13 are connected to each other. The substrate for mounting the semiconductor device has electrodes 120 and electrodes 121 in the rear surface opposite to the semiconductor device-mounting surface as occasion demands.

To mount the semiconductor device 13 on a substrate used for various kinds of electronic appliances, it is necessary to melt thermally the protrusive electrodes 121 provided on the substrate 115. The gap between the semiconductor device 13 and the substrate 115 is reinforced by the resin 118 in order to improve greatly reliability in these mounting steps and various kinds of tests, especially reliability results of a drop impact test.

A liquid epoxy resin, a phenol resin, a polyimide resin, a silicone resin, or the like, generally used for semiconductor sealing can be used as the resin 118 with which the gap between the semiconductor device 13 and the substrate 115 is filled. To adjust the thermal expansion coefficient and elastic modulus of the sealing resin, one kind or two or more kinds of particles made of inorganic materials such as silica, alumina, boron nitride, etc. may be blended with the sealing resin. A resin such as silicone or thermoplastic resin, a coupling agent such as alkoxysilane or titanate, a colorant, a fire retardant and a fire retardancy assistant for providing fire retardancy, a cure accelerator for accelerating the curing reaction of the resin layer, etc. may be mixed with the sealing resin as occasion demands.

In this embodiment, the semiconductor device can be connected to any kind of electronic appliance through a predetermined substrate even in the case where the pitch of protrusive electrodes on the semiconductor device is different from the pitch of electrodes of a substrate used in any kind of electronic appliance.

The semiconductor device can be mounted on a circuit substrate used in a general electronic appliance in the same manner as in the case where the semiconductor device is mounted on the substrate as a part of the semiconductor device.

According to the present invention, a semiconductor device is provided in which flip chip bonding can be performed without any underfill.

What is claimed is:

1. A semiconductor apparatus comprising a semiconductor device having circuit electrodes aligned centrally of the semiconductor apparatus, a first electrically insulating layer formed on said semiconductor device with said circuit electrodes being exposed from said first insulating layer, a second electrically insulating layer formed on said first insulating layer, external connection terminals formed on said second insulating layer, a wiring formed on said second insulating layer to electrically connect said external connect terminals to said circuit electrodes of said semiconductor device, and a third electrically insulating layer formed on said second insulating layer and on said wiring, wherein said second insulating layer contains particles to control a shape of said second insulating layer.

2. A semiconductor apparatus according to claim 1, wherein said second insulating layer is a stress relaxation layer to relieve stress caused between said semiconductor device and a board on which the apparatus is to be mounted.

3. A semiconductor apparatus according to claim 1, wherein said particles are made of a same material as that of said second insulating layer.

4. A semiconductor apparatus according to claim 1, wherein said second insulating layer contains particles of an organic material.

5. A semiconductor apparatus according to claim 1, wherein said second insulating layer at least contains particles of an amide-imide resin, of an ester-imide resin, of an ether-imide resin, of a silicone resin, or an acrylic resin, of a polyester resin.

6. A semiconductor apparatus according to claim 1, wherein said second insulating layer has a thickness of from 35 $\mu$m to 150 $\mu$m.

7. A semiconductor apparatus according to claim 1, wherein said second insulating layer is a printed layer of an insulating material containing particles, formed by use of a print mask.

8. A semiconductor apparatus comprising a semiconductor device, having circuit electrodes aligned centrally of the semiconductor apparatus, a first electrically insulating layer formed on said semiconductor device, with said circuit electrodes being exposed from said first insulating layer, a second electrically insulating layer formed on said first insulating layer, external connection terminals formed on said second insulating layer, a wiring formed on said second insulating layer to electrically connect said external connection terminals to said circuit electrodes of said semiconductor device, and a third electrically insulating layer formed on said second insulating layer and on said wiring, wherein said third insulating layer covers an upper surface and a side surface of each of said first insulating layer and said second insulating layer except where said external connection terminals and said wiring are connected to each other.

9. A semiconductor apparatus according to claim 8, wherein said second insulating layer is provided to relax stress produced between the semiconductor apparatus and a substrate on which to mount the apparatus.

10. A semiconductor apparatus according to claim 8, wherein said second insulating layer has a thickness of from 35 $\mu$m to 150 $\mu$m.

11. A semiconductor apparatus according to claim 8, wherein said second insulating layer contains particles to controlling a shape of said second insulating layer.

12. A semiconductor apparatus according to claim 8, wherein said second insulating layer includes means for relaxing stress produced between the semiconductor apparatus and a substrate on which to mount the apparatus.

13. A semiconductor apparatus according to claim 8, wherein said second insulating layer has a thickness of from 35 $\mu$m to 150 $\mu$m.

14. A semiconductor apparatus according to claim 8, wherein said second insulating layer includes means for controlling a shape of said second insulating layer.

15. A semiconductor apparatus according to claim 14, wherein said means for controlling a shape of said second insulating layer comprises particles included in the second insulating layer.

16. A semiconductor apparatus comprising a semiconductor device having circuit electrodes aligned centrally of the semiconductor apparatus, a first electrically insulating layer formed on said semiconductor device with said circuit electrodes being exposed from said first insulating layer, a second electrically insulating layer formed on said first insulating layer, external connection terminals formed on said second insulating layer, a wiring formed on said second insulating layer to electrically connect said external connect terminals to said circuit electrodes of said semiconductor device, and a third electrically insulating layer formed on said second insulating layer and on said wiring, wherein said second insulating layer contains means for controlling a shape of said second insulating layer.

17. A semiconductor apparatus according to claim 16, wherein said means for controlling a shape of said second insulating layer comprises particles formed in said second insulating layer.

18. A semiconductor apparatus according to claim 17, wherein said second insulating layer includes means for relieving stress caused between said semiconductor device and a board on which the apparatus is to be mounted.

19. A semiconductor apparatus according to claim 16, wherein said second insulating layer includes means for relieving stress caused between said semiconductor device and a board on which the apparatus is to be mounted.

20. A semiconductor apparatus according to claim 16, wherein said particles are made of a same material as that of said second insulating layer.

21. A semiconductor apparatus according to claim 16, wherein said second insulating layer contains particles of organic material.

22. A semiconductor apparatus according to claim 16, wherein said second insulating layer at least contains particles of an amide-imide resin, of an ester-imide resin, of an ether-imide resin, of a silicone resin, or an acrylic resin, of a polyester resin.

23. A semiconductor apparatus according to claim 16, wherein said second insulating layer has a thickness of from 35 $\mu$m to 150 $\mu$m.

24. A semiconductor apparatus according to claim 16, wherein said second insulating layer is a printed layer of an insulating material containing particles, formed by use of a print mask.

* * * * *